United States Patent
Aratake et al.

(10) Patent No.: US 8,020,264 B2
(45) Date of Patent: Sep. 20, 2011

(54) METHOD OF MANUFACTURING A PIEZOELECTRIC VIBRATOR

(75) Inventors: Kiyoshi Aratake, Chiba (JP); Yasuo Kawada, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/794,180

(22) Filed: Jun. 4, 2010

(65) Prior Publication Data

US 2010/0237740 A1    Sep. 23, 2010

Related U.S. Application Data

(63) Continuation of application No. PCT/JP2008/071571, filed on Nov. 27, 2008.

(30) Foreign Application Priority Data

Dec. 20, 2007  (JP) ................................. 2007-328416

(51) Int. Cl.
*H04R 17/00* (2006.01)
*H05K 3/10* (2006.01)
(52) U.S. Cl. ............. 29/25.35; 29/830; 29/417; 29/852; 310/311; 310/344; 310/370
(58) Field of Classification Search ................. 29/25.35, 29/594, 827, 412, 417, 830, 847, 852; 310/311, 310/312, 322, 344, 370
See application file for complete search history.

(56) References Cited

U.S. PATENT DOCUMENTS 3,766,616 A * 10/1973 Staudte ........................ 29/25.35

FOREIGN PATENT DOCUMENTS

| JP | 55023673 A | * | 2/1980 | ............... 29/25.35 X |
| JP | 06-343017 A | | 12/1994 | |
| JP | 2001-177373 A | | 6/2001 | |
| JP | 2007-013628 A | | 1/2007 | |

OTHER PUBLICATIONS

Machine Language Translation of JP 2007-013628.*
International Search Report for International Application No. PCT/JP2008/071571, dated Feb. 3, 2009, 1 page.

* cited by examiner

*Primary Examiner* — A. Dexter Tugbang
(74) *Attorney, Agent, or Firm* — Brinks Hofer Gilson & Lione

(57) ABSTRACT

There is provided a method of manufacturing piezoelectric vibrators 1. The method includes a process for through holes 35 and 36, which pass through a base substrate wafer, so that openings of the through holes are opened to the outside of the recesses for cavities C; a process for patterning a bonding layer 30, pairs of mounting layers, and pairs of extraction electrode layers 33 and 34 on the upper surface of the base substrate wafer with the same conductive material; and a process for electrically isolating the extraction electrode layers 34 in the middle by irradiating a part (area S2) of the extraction electrode layers 34, which are formed between the bonding layer and openings of through holes 36, with laser light after both the wafers are anodically bonded to each other. The bonding layer 30 surrounds the recesses, the pairs of mounting layers are in the recesses, and the pairs of extraction electrode layers 33 and 34 electrically connect the pairs of mounting layers to the bonding layer.

9 Claims, 19 Drawing Sheets

METHOD OF MANUFACTURING A PIEZOELECTRIC VIBRATOR

RELATED APPLICATIONS

This application is a continuation of PCT/JP2008/071571 filed on Nov. 27, 2008, which claims priority to Japanese Application No. JP2007-328416 filed on Dec. 20, 2007. The entire contents of these applications are incorporated herein by reference.

TECHNICAL FIELD

The present invention relates to a method of manufacturing a surface mounted (SMD) piezoelectric vibrator where a piezoelectric vibrating reed is sealed in a cavity formed between two bonded substrates, a piezoelectric vibrator manufactured by the method, and an oscillator, an electronic device, and a radio clock that each include the piezoelectric vibrator.

BACKGROUND ART

In recent years, a piezoelectric vibrator, which employs crystal or the like as a time source, a timing source of a control signal or the like, a reference signal source or the like, has been used in a cell phone or a portable information terminal device. Various piezoelectric vibrators have been known as this kind of piezoelectric vibrator, but a surface mounted piezoelectric vibrator has been known as one of the piezoelectric vibrators. As this kind of piezoelectric vibrator, there is generally known a piezoelectric vibrator having a three-layer structure where a piezoelectric substrate including a piezoelectric vibrating reed is bonded to a base substrate and a lid substrate so as to be interposed between the base substrate and the lid substrate in a vertical direction. In this case, the piezoelectric vibrator is received in a cavity (closed chamber) that is formed between the base substrate and the lid substrate. Further, in recent years, there has been developed a piezoelectric vibrator having not a three-layer structure but a two-layer structure.

This type of piezoelectric vibrator has a two-layer structure where a base substrate and a lid substrate are directly bonded to each other and a piezoelectric vibrating reed is received in a cavity formed between both the substrates.

The two-layer structure type piezoelectric vibrators are superior to three-layer structure type piezoelectric vibrators in terms of the reduction in thickness. Accordingly, the two-layer structure type piezoelectric vibrators are preferably used. As one of the piezoelectric vibrators, there is known a piezoelectric vibrator where external electrodes formed on a base substrate are electrically connected to a piezoelectric vibrating reed by using through holes (see Patent Document 1).

As shown in FIGS. 22 and 23, a piezoelectric vibrator 200 includes a base substrate 201 and a lid substrate 202 that are anodically bonded to each other, and a piezoelectric vibrating reed 203 that is sealed in a cavity C formed between both the substrates 201 and 202.

Through holes 204, which pass through the substrate 201, are formed at the base substrate 201, and conductive films 205 are formed so as to extend over the upper and lower surfaces of the base substrate 201 through the inner surfaces of the through holes 204. Portions of the conductive films 205, which are formed on the upper surface of the base substrate 201, function as mounting pads 205a that are electrically connected to the piezoelectric vibrating reed 203. Portions of the conductive films, which are formed on the lower surface of the base substrate 201, function as external electrodes 205b that are electrically connected to the outside. In addition, a part of the mounting pads 205a are used as a bonding film when the base substrate 201 and the lid substrate 202 are anodically bonded to each other. Further, since the mounting pads 205a come into close contact with both the substrates 201 and 202 when the substrates are anodically bonded to each other, the through holes 204 are sealed. Furthermore, a bonding film 206 for anodic bonding is formed between the base substrate 201 and the lid substrate 202 so as to surround the cavity C.

When the base substrate 201 and the lid substrate 202 are anodically bonded to each other in order to manufacture the piezoelectric vibrator 200 having the above-mentioned structure, as shown in FIG. 22, a predetermined voltage is applied between the lid substrate 202 and the conductive films 205 that function as the bonding film 206 and the external electrodes 205b. Accordingly, both the substrates 201 and 202 are solidly bonded to each other by anodic bonding with a part of the conductive films 205 and the bonding film 206 interposed therebetween. As a result, it may be possible to seal the through holes 204 and to seal airtight the piezoelectric vibrating reed 203 in the cavity C. Further, since the piezoelectric vibrating reed 203 can be electrically connected to the outside through the conductive films 205, it may be possible to reliably make the piezoelectric vibrating reed 203 operate in the cavity C.

Patent Citation 1: JP-A-6-343017

DISCLOSURE OF THE INVENTION

However, the piezoelectric vibrator 200 in the related art still has the following problems. First, as electronic devices have been reduced in size in recent years, there is a demand for the further reduction of the size of the piezoelectric vibrator 200 that is mounted on various electronic devices. Naturally, there is also a demand on the further reduction of the size of the piezoelectric vibrating reed 203 that is received in the cavity C. Accordingly, it is preferable that the diameter of the through hole 204 formed at the base substrate 201 be reduced as much as possible. Meanwhile, if the diameter of the through hole 204 is reduced, it is difficult to uniformly form the conductive film 205 on the inner surface of the through hole at a constant thickness. For this reason, a sputtering method or the like has been generally used to form a film, but there has been a possibility that the conductive films 205 are broken in the middle thereof as shown in FIG. 24 without being reliably formed on the inner surfaces of the through holes 204.

As a result, there has been a concern that the following disadvantages occur. That is, the anodic bonding becomes incomplete, so that it may not be possible to seal the cavity C or to electrically connect the piezoelectric vibrating reed 203 by the conductive films 205.

Further, when the anodic bonding is performed, both the substrates 201 and 202 are generally bonded to each other in the state of a wafer. That is, a base substrate wafer that forms the base substrate 201 later is anodically bonded to a lid substrate wafer that forms the lid substrate 202 later. Further, a method of manufacturing a plurality of piezoelectric vibrators 200 by cutting both the wafers, which are anodically bonded to each other, into lattices is a general method.

Meanwhile, a plurality of through holes 204 is formed at the base substrate wafer so as to correspond to the number of piezoelectric vibrating reeds 203, and a plurality of conductive films 205 is patterned on the base substrate wafer. In this case, even though the above-mentioned disadvantages do not occur and the conductive films 205 are formed on the inner surfaces of the through holes 204 without problems, there has been a concern that the following disadvantages occur.

That is, a voltage needs to be applied to the plurality of conductive films 205 formed on the base substrate wafer in order to perform the anodic bonding. Accordingly, in general, the base substrate wafer is placed on a flat plate-shaped electrode and the portions of the conductive films 205 functioning as the external electrodes 205b need to be electrically connected to the electrode entirely. However, as shown in FIG. 25, a part of the external electrodes 205b does not come into contact with the electrode 207 and is apt to float from the electrode due to the slight bend of the base substrate wafer or foreign materials interposed between the wafer and the electrode. For this reason, bonding failure partially occurs. As a result, there has been a concern that both the wafers do not uniformly come into contact with each other over the entire surfaces thereof.

The invention has been made in consideration of the above-mentioned circumstances, and an object of the invention is to provide a method capable of efficiently manufacturing a surface mounted piezoelectric vibrator where a base substrate wafer and a lid substrate wafer can be uniformly bonded to each other over the entire surfaces thereof, a cavity is reliably sealed, and external electrodes and a piezoelectric vibrating reed can be electrically connected to each other by using through holes.

Further, there are provided a piezoelectric vibrator that is manufactured by the method of manufacturing a piezoelectric vibrator, and an oscillator, an electronic device, and a radio clock that each include the piezoelectric vibrator.

The invention provides the following means in order to solve the above-mentioned problems.

According to the invention, there is provided a method of manufacturing a plurality of piezoelectric vibrators at a time by using a base substrate wafer and a lid substrate wafer. A piezoelectric vibrating reed of the piezoelectric vibrator is sealed in a cavity formed between a base substrate and a lid substrate that are anodically bonded to each other. The method includes a recess forming process for forming a plurality of recesses for cavities, which form the cavities when both the wafers are superimposed, on at least one of the base substrate wafer and the lid substrate wafer; a through hole forming process for forming pairs of through holes, which pass through the base substrate wafer, so that openings of the through holes are opened to the outside of the recesses; a patterning process for patterning a bonding layer, pairs of mounting layers, and pairs of extraction electrode layers on the upper surface of the base substrate wafer with the same conductive material; a superimposing process for superimposing both the wafers so as to receive the piezoelectric vibrating reeds in the cavities, which are surrounded by the recesses and both the wafers, after the piezoelectric vibrating reeds are mounted on the pairs of mounting layers, respectively; a bonding process for anodically bonding both the wafers by applying a voltage between the bonding layer and the lid substrate wafer, and sealing the piezoelectric vibrating reeds in the cavities; an isolating process for electrically isolating the extraction electrode layers from the bonding layer in the middle by irradiating the pairs of extraction electrode layers, which are formed between the bonding layer and the openings of pairs of through holes, with laser light; an external electrode forming process for forming external electrodes, which are exposed to the lower surface of the base substrate wafer, by closing the pairs of through holes with a conductive material; and a cutting process for cutting both the wafers, which are bonded to each other, into the plurality of piezoelectric vibrators. The bonding layer surrounds the recesses. The pairs of mounting layers are electrically connected to the piezoelectric vibrating reeds, and are in the recesses. The pairs of extraction electrode layers are led out from the inside of the recesses to the outside of the recesses so as to pass over the openings on the outside of the recesses, and electrically and separately connect the pairs of mounting layers to the bonding layer. In the patterning process, the pairs of extraction electrode layers are patterned so as to pass over the openings while covering peripheral portions of the openings.

According to the invention, there is provided a piezoelectric vibrator that includes a base substrate, a lid substrate, a piezoelectric vibrating reed, a pair of mounting layers, a pair of extraction electrode layers, a pair of through holes, and external electrodes. The base substrate and the lid substrate are anodically bonded to each other with a bonding layer interposed therebetween. The piezoelectric vibrating reed is sealed in a cavity formed between both the substrates. The pair of mounting layers is formed on the upper surface of the base substrate so as to be in the cavity and is electrically connected to the piezoelectric vibrating reed. The pair of extraction electrode layers is formed on the upper surface of the base substrate, is electrically connected to the pair of mounting layers, respectively, and comes into close contact with the lid substrate at a position where the extraction electrode layers are led to the outside of the cavity. The pair of through holes is formed so as to pass through the base substrate, and openings of the through holes are opened to the middle of the pair of extraction electrode layers led to the outside of the cavity, respectively. The size of the through holes is set so that the peripheral portions of openings of the through holes are surrounded by the extraction electrode layers. The external electrodes are formed so as to close the pair of through holes and are exposed to the lower surface of the base substrate wafer.

In the piezoelectric vibrator and the method of manufacturing the piezoelectric vibrators according to the invention, first, there is performed a recess forming process for forming a plurality of recesses for cavities on at least one of the base substrate wafer and the lid substrate wafer. These recesses form the cavities when both the wafers are superimposed later.

Then, there is performed a through hole forming process for forming pairs of through holes that pass through the base substrate wafer. In this case, openings of the through holes are opened to not the inside of the recesses (the inner sides of the recesses) but the outside of the recesses (the outer sides of the recesses).

After that, there is performed a patterning process for patterning a bonding layer, pairs of mounting layers, and pairs of extraction electrode layers on the upper surface of the base substrate wafer with the same conductive material. When anodic bonding is performed later, a voltage is applied to the bonding layer among them. The bonding layer is formed so as to surround the recesses. Further, the pairs of mounting layers are electrically connected to the piezoelectric vibrating reeds, and the piezoelectric vibrating reeds are mounted on the pairs of mounting layers. The pairs of mounting layers are formed so as to be in the recesses. Furthermore, the pairs of extraction electrode layers are patterned between the bonding layer and the pairs of mounting layers, and electrically and separately connect the pairs of mounting layers to the bonding layer. Specifically, the pairs of extraction electrode layers are patterned so as to be led out from the inside of the recesses to the outside of the recesses and so as to pass over the openings of the pairs of through holes on the outside of the recesses. In this case, the pairs of extraction electrode layers are patterned not to pass through a part of the openings and to pass over the openings while covering peripheral portions of the openings. Accordingly, the peripheral portions of the openings are surrounded by the extraction electrode layers.

When the patterning process has been performed, all of the bonding layer, the pairs of mounting layers, and the pairs of extraction electrode layers are electrically connected to one another.

After the above-mentioned respective processes are completed, there is performed a superimposing process. First, the piezoelectric vibrating reeds are mounted on the pairs of mounting layers, which are formed so as to be in the plurality of recesses, so as to be superimposed on the pairs of mounting layers and are bonded to the piezoelectric vibrating reeds. Accordingly, the plurality of piezoelectric vibrating reeds is supported by the pairs of mounting layers, respectively, while being electrically connected to the pairs of mounting layers. Further, after the piezoelectric vibrating reeds are mounted, the lid substrate wafer is superimposed on the base substrate wafer. Accordingly, it may be possible to receive the piezoelectric vibrating reed in the cavity that is surrounded by the recess and both the wafers.

After the superimposing process, there is performed a bonding process for anodically bonding both the wafers by applying a predetermined voltage between the bonding layer and the lid substrate wafer. Accordingly, the bonding layer and the lid substrate wafer solidly come into close contact with each other, so that it may be possible to seal the piezoelectric vibrating reeds in the cavities. Further, since the bonding layer is electrically connected to the pairs of extraction electrode layers as described above, a voltage is also applied to the pairs of extraction electrode layers when a voltage is applied. Accordingly, likewise, the pairs of extraction electrode layers, which are led to the outside of the recesses, also solidly come into close contact with the lid substrate wafer. Therefore, the peripheral portions of the openings of the through holes are reliably sealed, so that airtightness in the cavity is not impaired through the through holes.

In particular, since the bonding layer is previously electrically connected to the pair of extraction electrode layers by the patterning process, there is no concern that sealing in the cavity becomes unreliable as in the method of applying a voltage through the conductive films formed on the inner surfaces of the through holes in the related art. That is, since anodic bonding is performed without affecting the existence of the through holes, it may be possible to reliably perform bonding. In addition, it may also be possible to simultaneously apply a voltage to all of the pairs of extraction electrode layers by only applying a voltage to the bonding layer. Accordingly, even though the wafer is bent, it may be possible to uniformly bond the lid substrate wafer to the base substrate wafer over the entire surfaces of the wafers. Moreover, since the application of a voltage is simple in comparison with the related art, it may be possible to apply a voltage in a short time. As a result, it may be possible to improve manufacturing efficiency.

After the bonding is terminated, there is performed an isolating process for electrically isolating the extraction electrode layers from the bonding layer in the middle. That is, the areas of the extraction electrode layers, which are formed between the bonding layer and the openings of the other through holes, are irradiated with laser light, so that the areas of the extraction electrode layers are cut. Accordingly, the extraction electrode layers are isolated in the middle, and are electrically isolated from the bonding layer. The pairs of extraction electrode layers and the pairs of mounting layers become electrically independent of the bonding layer by this process.

Subsequently, there is performed an external electrode forming process for forming the external electrodes by closing the pairs of through holes with a conductive material. In this case, the external electrodes are formed so as to be exposed to the lower surface of the base substrate wafer. In particular, since the peripheral portions of the openings of the through holes are surrounded by the extraction electrode layers, the external electrodes are electrically connected to the other extraction electrode layers by this process. Accordingly, it may be possible to actuate the piezoelectric vibrating reed, which is sealed in the cavity, by using the external electrodes.

Further, after the external electrodes are formed, there is performed a cutting process for cutting the base substrate wafer and the lid substrate wafer, which are bonded to each other, into a plurality of piezoelectric vibrators.

As a result, it may be possible to manufacture a plurality of surface mounted piezoelectric vibrators, where the piezoelectric vibrating reed is sealed in the cavity formed between the base substrate and lid substrate anodically bonded to each other, at a time.

In particular, it may be possible to more efficiently manufacture the piezoelectric vibrator that can reliably seal the cavity and secure electric conductivity between the piezoelectric vibrating reed and the external electrodes by using the through holes, and to reduce the manufacturing cost of the piezoelectric vibrator. As a result, it may be possible to obtain the piezoelectric vibrator that has high reliability, high quality, and low manufacturing cost.

Further, in the method of manufacturing the piezoelectric vibrators according to the invention, in the patterning process, the bonding layer may be patterned so as to pass over the openings of one through holes of the pairs of through holes while covering peripheral portions of the openings of one through holes of the pairs of through holes. Further, one extraction electrode layers of pairs of extraction electrode layers are patterned so as to be connected to the bonding layer, and the other extraction electrode layers thereof are patterned so as to be connected to the bonding layer after passing over the openings of the other through holes while covering peripheral portions of the openings of the other through holes. In the isolating process, the extraction electrode layers, which are formed between the bonding layer and the openings of the other through holes, may be irradiated with laser light.

Further, in the piezoelectric vibrator according to the invention, one extraction electrode layer of the pair of extraction electrodes may be electrically connected to the bonding layer, the opening of one through hole of the pair of through holes may be opened to the bonding layer, and the size of the one through hole may be set so that the peripheral portion of the opening of one through hole is surrounded by the bonding layer.

In the piezoelectric vibrator and the method of manufacturing the piezoelectric vibrators according to the invention, when the bonding layer is formed in the patterning process, the bonding layer is patterned so as to pass over the opening of one through hole of the pair of through holes, of which the openings are opened to the outside of the recess, while covering the peripheral portion of the opening. Accordingly, the peripheral portion of the opening of one through hole is surrounded by the bonding layer.

When the pair of extraction electrode layers is formed, one extraction electrode layer is patterned so as to be directly connected to the bonding layer regardless of the through hole and the other extraction electrode layer is patterned so as to be connected to the bonding layer after passing over the opening of the other through hole while covering the peripheral portion of the opening of the other through hole. Accordingly, the peripheral portion of the opening of the other through hole is surrounded by the other extraction electrode layer.

Further, in the isolating process, the extraction electrode layers, which are formed between the bonding layer and the openings of the other through holes, are irradiated with laser light, and the other extraction electrode layer where the through hole is formed is isolated in the middle. Accordingly, it may be possible to electrically isolate the other extraction electrode layer, where the through hole is formed, from the bonding layer.

Meanwhile, the bonding layer where one through hole is formed is electrically connected to one extraction electrode layer. However, since the bonding layer is electrically isolated from the other extraction electrode layer, the bonding layer functions to electrically connect the other extraction electrode layer to the external electrode after the external electrode is formed. Accordingly, it may also be possible to actuate the piezoelectric vibrating reed by using the external electrodes.

In particular, since one through hole is formed at the bonding layer, it may be possible to make the length of one extraction electrode layer be very short. Accordingly, it may be possible to make the design of the piezoelectric vibrator be compact and to reduce the size of the piezoelectric vibrator.

Further, in the method of manufacturing the piezoelectric vibrators according to the invention, when the extraction electrode layers are patterned in the patterning process, areas to be isolated in the isolating process are previously patterned so as to be narrower than other portions.

In the method of manufacturing the piezoelectric vibrators according to the invention, when the extraction electrode layers are patterned, areas to be isolated later by the irradiation of laser light are previously patterned so as to be narrower than other portions. Accordingly, it may be possible to reliably isolate the extraction electrode layer in a short time and to reduce time required for the isolating process. As a result, it may be possible to further improve manufacturing efficiency.

Further, according to the invention, there is provided an oscillator where the piezoelectric vibrator according to the invention is electrically connected to an integrated circuit as an oscillating component.

Furthermore, according to the invention, there is provided an electronic device where the piezoelectric vibrator according to the invention is electrically connected to a clock unit.

In addition, according to the invention, there is provided a radio clock where the piezoelectric vibrator according to the invention is electrically connected to a filter unit.

The oscillator, the electronic device, and the radio clock according to the invention each include the above-mentioned piezoelectric vibrator. Accordingly, likewise, it may also be possible to improve the quality and reliability of the oscillator, the electronic device, and the radio clock and to reduce the manufacturing cost thereof.

According to the method of manufacturing piezoelectric vibrators of the invention, it may be possible to uniformly bond the lid substrate wafer to the base substrate wafer over the entire surfaces of the wafers, and to efficiently manufacture the surface mounted piezoelectric vibrator, which can reliably seal the cavity and secure electric conductivity between the piezoelectric vibrating reed and the external electrodes by using the through holes, at a time.

Further, the piezoelectric vibrator according to the invention is manufactured by the above-mentioned manufacturing method. Accordingly, the cavity is reliably sealed, the reliability and quality of the piezoelectric vibrator are improved, and the manufacturing cost of the piezoelectric vibrator is reduced.

The oscillator, the electronic device, and the radio clock according to the invention each include the above-mentioned piezoelectric vibrator. Accordingly, likewise, it may also be possible to improve the quality and reliability of the oscillator, the electronic device, and the radio clock and to reduce the manufacturing cost thereof.

DETAILED DESCRIPTION OF THE PREFERRED EMBODIMENTS

Figure 1:
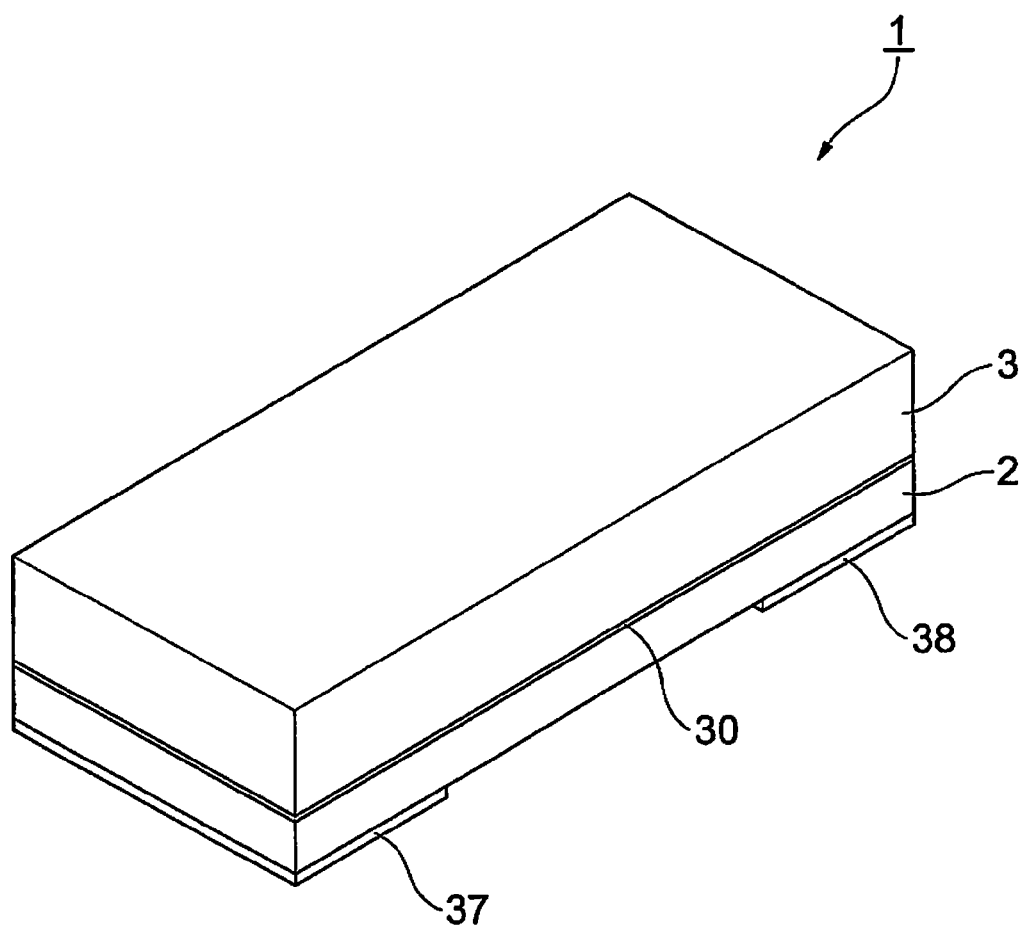
FIG. 1 is a perspective view showing the appearance of an embodiment of a piezoelectric vibrator according to the invention.

An embodiment of the invention will be described below with reference to FIGS. 1 to 16.

As shown in FIGS. 1 to 4, a piezoelectric vibrator 1 according to this embodiment is formed in the shape of a two-layer box that includes a base substrate 2 and a lid substrate 3, and is a ceramic package type piezoelectric vibrator where a piezoelectric vibrating reed 4 is received in an inner cavity C.

Meanwhile, for the easy understanding of drawings, an excitation electrode 15, extraction electrodes 19 and 20, mount electrodes 16 and 17, and a weight metal film 21, which are to be described below, are not shown in FIG. 4.

Figure 5:
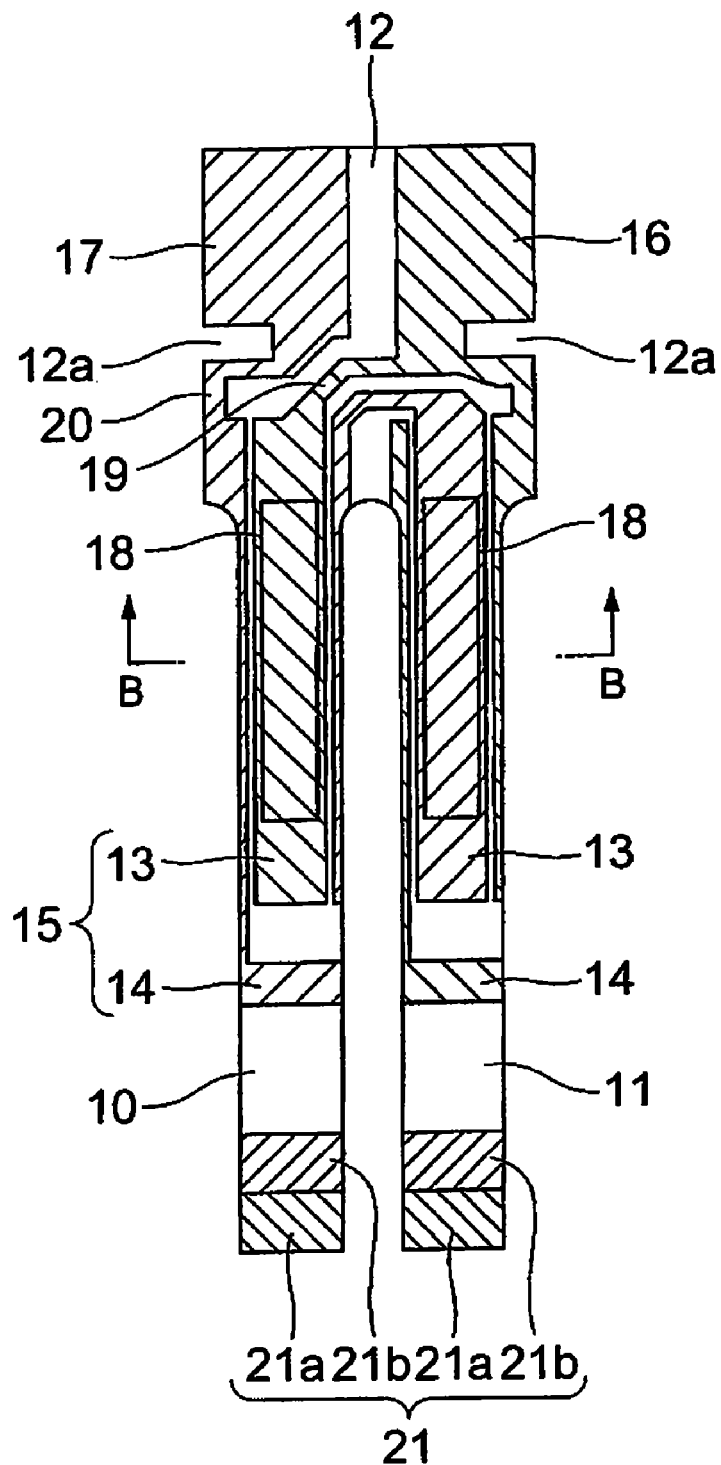
FIG. 5 is a top view of a piezoelectric vibrating reed of the piezoelectric vibrator shown in FIG. 1.
Figure 6:
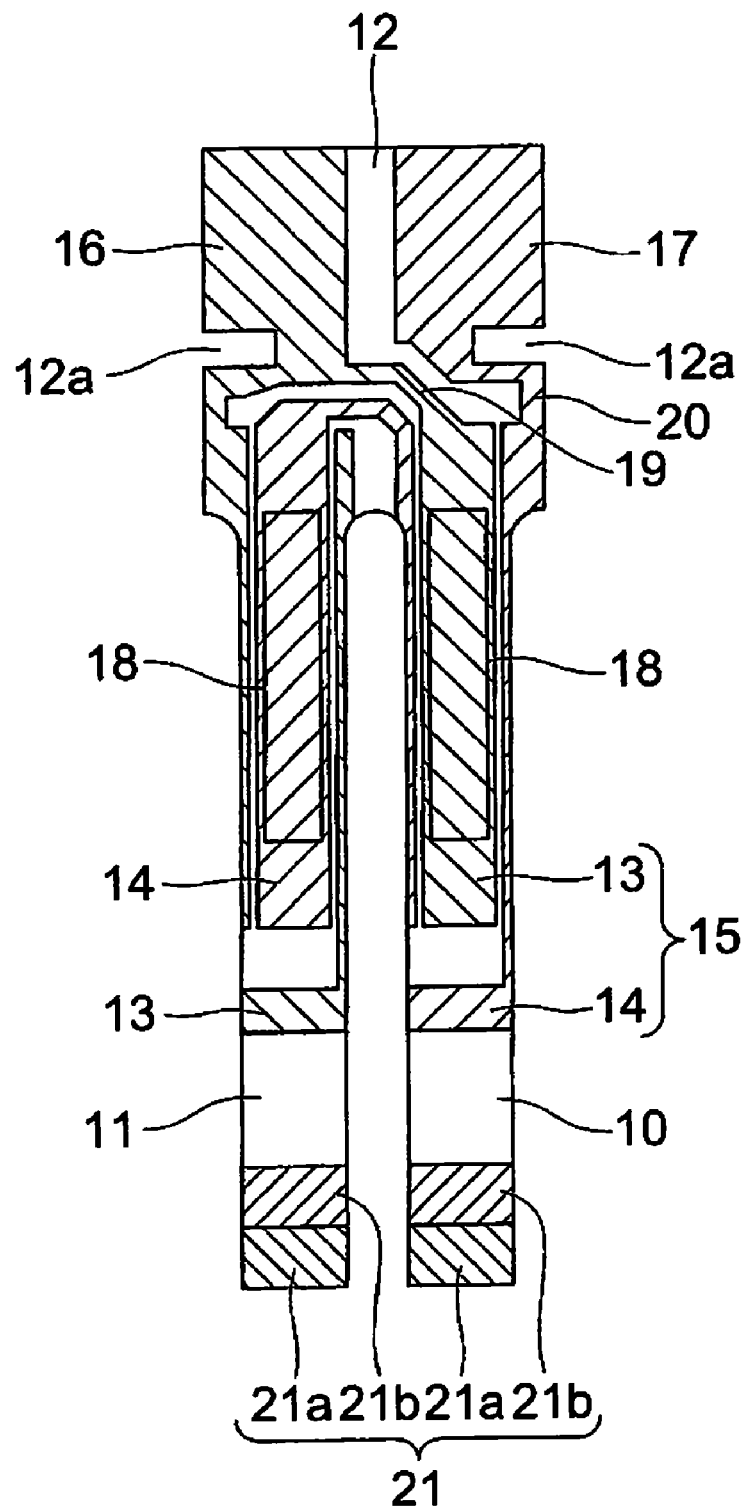
FIG. 6 is a bottom view of the piezoelectric vibrating reed shown in FIG. 5.
Figure 7:
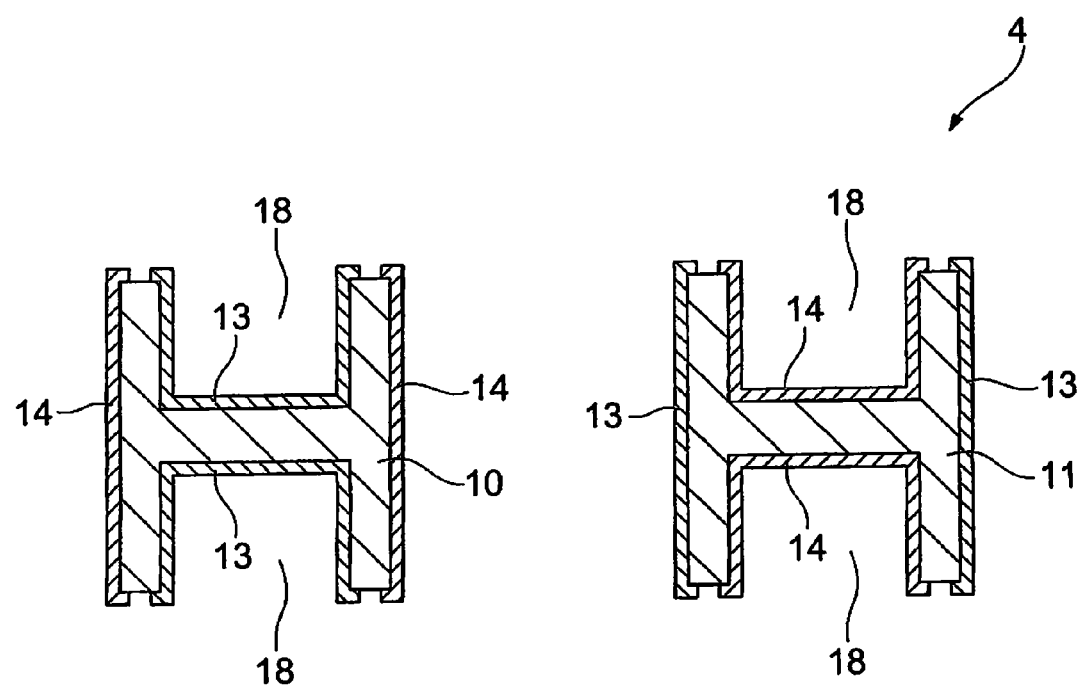
FIG. 7 is a cross-sectional view taken along a line B-B shown in FIG. 5.

As shown in FIGS. 5 to 7, the piezoelectric vibrating reed 4 is a tuning-fork type vibrating reed that is made of a piezoelectric material, such as crystal, lithium tantalite, or lithium niobate. When a predetermined voltage is applied to the piezoelectric vibrating reed, the piezoelectric vibrating reed vibrates.

The piezoelectric vibrating reed 4 includes a pair of vibration arm portions 10 and 11 that is disposed parallel to each other, a base portion 12 that integrally fixes the base ends of the pair of vibration arm portions 10 and 11, excitation electrodes 15 that each include first and second excitation electrodes 13 and 14, and mount electrodes 16 and 17 that are electrically connected to the first and second excitation electrodes 13 and 14. The first and second excitation electrodes are formed on the outer surfaces of the pair of vibration arm portions 10 and 11, and vibrate the pair of vibration arm portions 10 and 11.

Further, the piezoelectric vibrating reed 4 of this embodiment includes groove portions 18 that are formed on the main surfaces of the pair of vibration arm portions 10 and 11 in the longitudinal directions X of the vibration arm portions 10 and 11, respectively. The groove portions 18 are formed from the base ends of the vibration arm portions 10 and 11 to the substantially middle portions thereof.

Cutout portions (hereinafter, referred to as notches) 12a are formed on both sides of the base portion 12 so that the width of the base portion 12 is partially reduced. The notches 12a are formed on the base portion at appropriate positions distant from the pair of vibration arm portions 10 and 11. When the pair of vibration arm portions 10 and 11 vibrate, the notches 12a suppress the bend of the base portion 12 caused by a vertical component (a component in a thickness direction) of the vibration and reduce the deviation of a resonant resistance value. The notches 12a are not essential, but it is preferable that the notches be formed in terms of the improvement of performance.

The excitation electrode 15 including the first and second excitation electrodes 13 and 14 is an electrode for vibrating the pair of vibration arm portions 10 and 11 at a predetermined resonant frequency in a direction where the vibration arm portions approach each other or are separated from each other. The first and second excitation electrodes are patterned on the outer surfaces of the pair of vibration arm portions 10 and 11 so as to be electrically isolated, respectively. Specifically, as shown in FIG. 7, the first excitation electrode 13 is mainly formed on the groove portions 18 of one vibration arm portion 10 and both side surfaces of the other vibration arm portion 11, and the second excitation electrode 14 is mainly formed on both side surfaces of one vibration arm portion 10 and the groove portions 18 of the other vibration arm portion 11.

Further, as shown in FIGS. 5 and 6, the first and second excitation electrodes 13 and 14 are electrically connected to the mount electrodes 16 and 17 through the extraction electrodes 19 and 20 on both the main surfaces of the base portion 12, respectively. Further, a voltage is applied to the piezoelectric vibrating reed 4 through the mount electrodes 16 and 17.

Meanwhile, the excitation electrodes 15, the mount electrodes 16 and 17, and the extraction electrodes 19 and 20, which have been described above, are formed by forming conductive films made of, for example, chrome (Cr), nickel (Ni), aluminum (Al), or titanium (Ti).

Furthermore, a weight metal film 21, which performs adjustment (frequency adjustment) so as to make the vibrational states of the vibration arm portions be in a predetermined frequency range, is formed at the ends of the pair of vibration arm portions 10 and 11. Meanwhile, the weight metal film 21 is divided into a rough adjustment film 21a that is used to roughly adjust frequency and a fine adjustment film 21b that is used to finely adjust frequency. It may be possible to make the frequency of the pair of vibration arm portions 10 and 11 be in the nominal frequency range of a device by performing frequency adjustment with the rough and fine adjustment films 21a and 21b.

Figure 2:
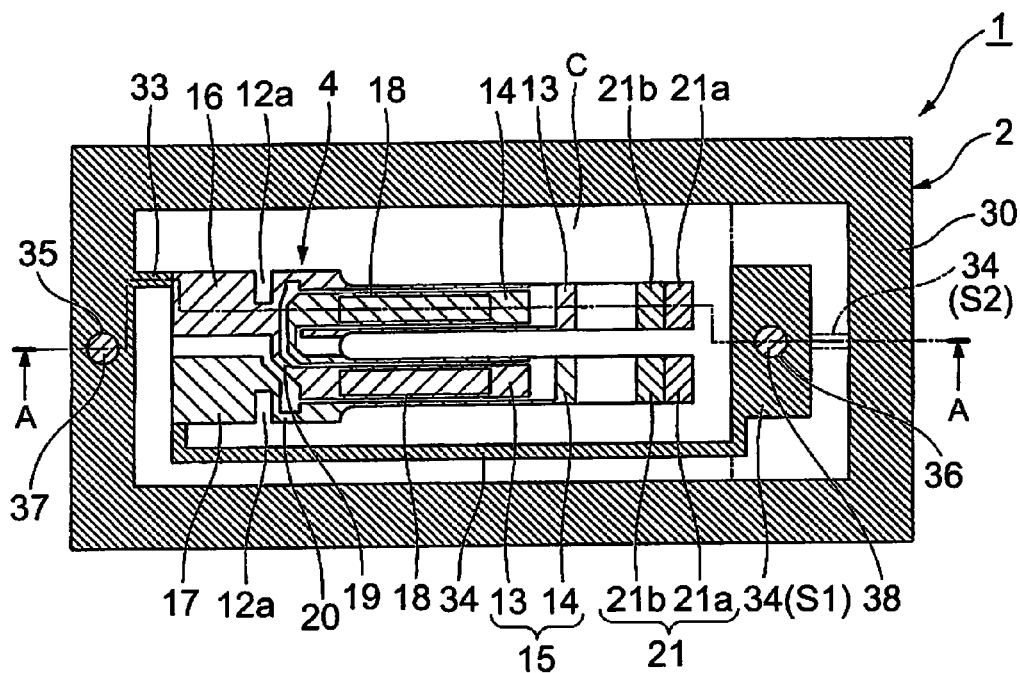
FIG. 2 is a view showing the internal structure of the piezoelectric vibrator shown in FIG. 1, and is a view showing a piezoelectric vibrating reed from the upper side when a lid substrate is removed.
Figure 3:
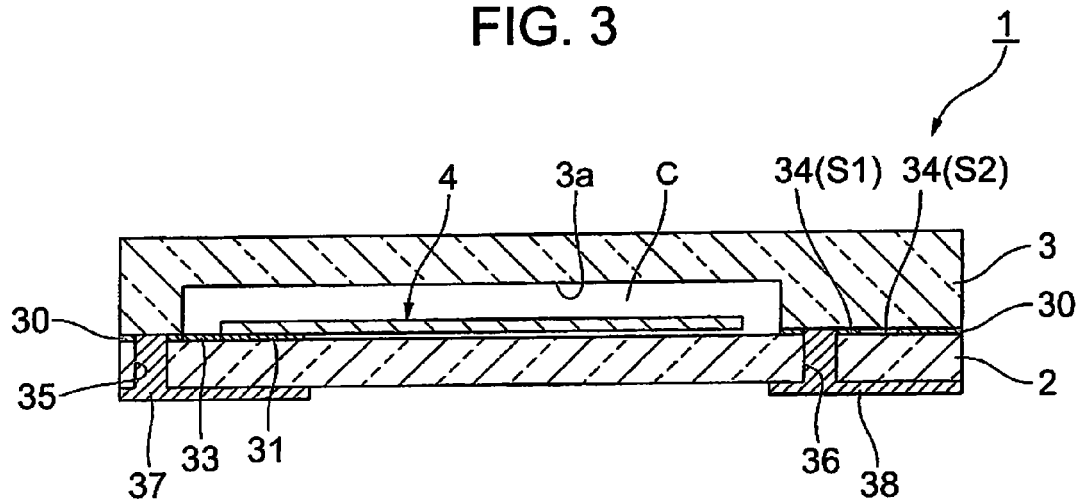
FIG. 3 is a cross-sectional view taken along a line A-A shown in FIG. 1.
Figure 4:
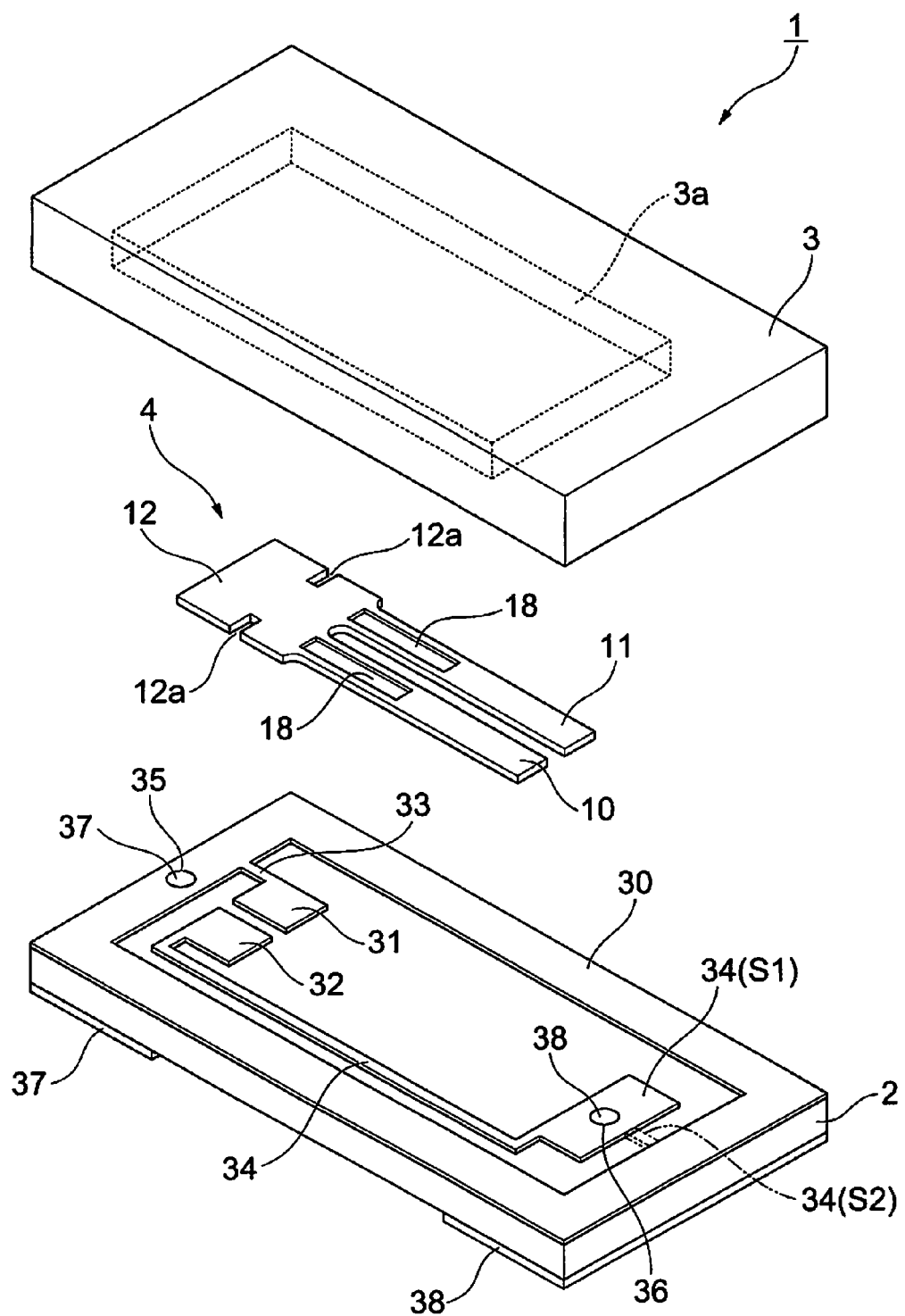
FIG. 4 is an exploded perspective view of the piezoelectric vibrator shown in FIG. 1.

In the piezoelectric vibrating reed 4 having the above-mentioned structure, as shown in FIGS. 2 to 4, the base portion 12 is placed on a pair of mounting layers 31 and 32 (to be described below) of the base substrate 2 and is mounted on the pair of mounting layers by a conductive adhesive (not shown) or bumps made of gold or the like. Accordingly, the mount electrodes 16 and 17 are electrically connected to the pair of mounting layers 31 and 32.

The lid substrate 3 is made of soda-lime glass, and is formed in the shape of a plate as shown in FIGS. 1, 3, and 4. Further, a rectangular recess 3a in which the piezoelectric vibrating reed 4 is received is formed on a bonding surface of the lid substrate to which the base substrate 2 is bonded. The recess 3a is a recess that forms a cavity C receiving the piezoelectric vibrating reed 4 when both the substrates 2 and 3 are superimposed.

Meanwhile, a case where the recess 3a is formed on the lid substrate 3 has been exemplified in this embodiment. However, a recess may be formed on the base substrate 2, or recesses may be formed on both the substrates 2 and 3, respectively.

The base substrate 2 is made of soda-lime glass like the lid substrate 3. As shown in FIGS. 1 to 4, the base substrate is formed in the shape of a plate so as to have a size capable of being superimposed on the lid substrate 3. A bonding layer 30, a pair of mounting layers 31 and 32, and a pair of extraction electrode layers 33 and 34 are patterned with the same conductive material (for example, aluminum) on the upper surface (to which the lid substrate 3 is bonded) of the base substrate 2.

Among them, the bonding layer 30 is formed along the periphery of the base substrate 2 so as to surround the recess 3a formed on the lid substrate 3. The pair of mounting layers 31 and 32 is formed so as to be in the recess 3a formed on the lid substrate 3 while being electrically isolated from each other. The pair of extraction electrode layers 33 and 34 is formed so as to be led out from the inside of the recess 3a, which is formed between the pair of mounting layers 31 and 32 and the bonding layer 30, to the outside of the recess 3a, and electrically connects the pair of mounting layers 31 and 32 to the bonding layer 30.

Meanwhile, the other extraction electrode layer 34 of the pair of extraction electrode layers 33 and 34 has been connected to the bonding layer 30 during manufacture. However, when the piezoelectric vibrator 1 is completely manufactured, the other extraction electrode layer is isolated in the middle.

In this embodiment, one extraction electrode layer 33 is formed so as to be in the recess 3a. Meanwhile, a part of the other extraction electrode layer 34 is formed so as to be in the recess 3a, and the rest thereof is formed so as to be interposed between both the substrates 2 and 3 outside the recess 3a. Further, an area S2 (which is shown by a dotted line) between the bonding layer 30 and an area S1 of the other extraction electrode layer 34, which is interposed between both the substrates 2 and 3, exists during manufacture, but does not exist when the piezoelectric vibrator 1 is completely manufactured. Accordingly, as described above, the other extraction electrode layer 34 is isolated in the middle.

Further, a pair of through holes 35 and 36, which passes through the base substrate 2, is formed at the base substrate 2. One through hole 35 of the through holes is formed so that an opening is opened to the bonding layer 30, and the other through hole 36 thereof is formed so that an opening is opened to the extraction electrode layer 34.

In more detail, one through hole 35 is formed so that an opening of one through hole is opened to the bonding layer 30 near one extraction electrode layer 33. The size of one through hole is set so that the peripheral portion of the opening of the one through hole is surrounded by the bonding layer 30. Furthermore, the other through hole 36 is formed so that an opening is opened to the area S1 of the other extraction electrode layer 34 interposed between both the substrates 2 and 3. The size of the other through hole is set so that the peripheral portion of the opening is surrounded by the extraction electrode layer 34.

The base substrate 2 and the lid substrate 3 are bonded to each other by anodic bonding that uses the above-mentioned bonding layer 30. That is, the bonding layer 30 formed on the base substrate 2 solidly comes into close contact with the lid substrate 3 by anodic bonding. In this case, the area S1 of the other extraction electrode layer 34, which is formed between both the substrates 2 and 3, also solidly comes into close contact with the lid substrate 3 by anodic bonding. For this reason, the peripheral portions of the openings of the pair of through holes 35 and 36 are reliably sealed by the bonding layer 30 and the other extraction electrode layer 34, respectively.

Moreover, the pair of through holes 35 and 36 of the base substrate 2 is filled with a conductive material, so that external electrodes 37 and 38 exposed to the lower surface of the base substrate 2 are formed. In this case, one external electrode 37 is electrically connected to the bonding layer 30, and the other external electrode 38 is electrically connected to the other extraction electrode layer 34. As a result, one external electrode 37 is electrically connected to the first excitation electrode 13 of the piezoelectric vibrating reed 4 through the bonding layer 30, one extraction electrode layer 33, and one mounting layer 31. Further, the other external electrode 38 is electrically connected to the second excitation electrode 14 of the piezoelectric vibrating reed 4 through the other extraction electrode layer 34 and the other mounting layer 32.

A predetermined driving voltage is applied to the external electrodes 37 and 38 formed on the base substrate 2 for the operation of the piezoelectric vibrator 1 having the above-mentioned structure. Accordingly, it may be possible to make current flow in the excitation electrode 15 including the first and second excitation electrodes 13 and 14 of the piezoelectric vibrating reed 4, and to vibrate the pair of vibration arm portions 10 and 11 at a predetermined frequency in a direction where the vibration arm portions approach each other or are separated from each other. Further, the vibration of the pair of vibration arm portions 10 and 11 may be used as a time source, a timing source of a control signal, a reference signal source, and the like.

Figure 8:
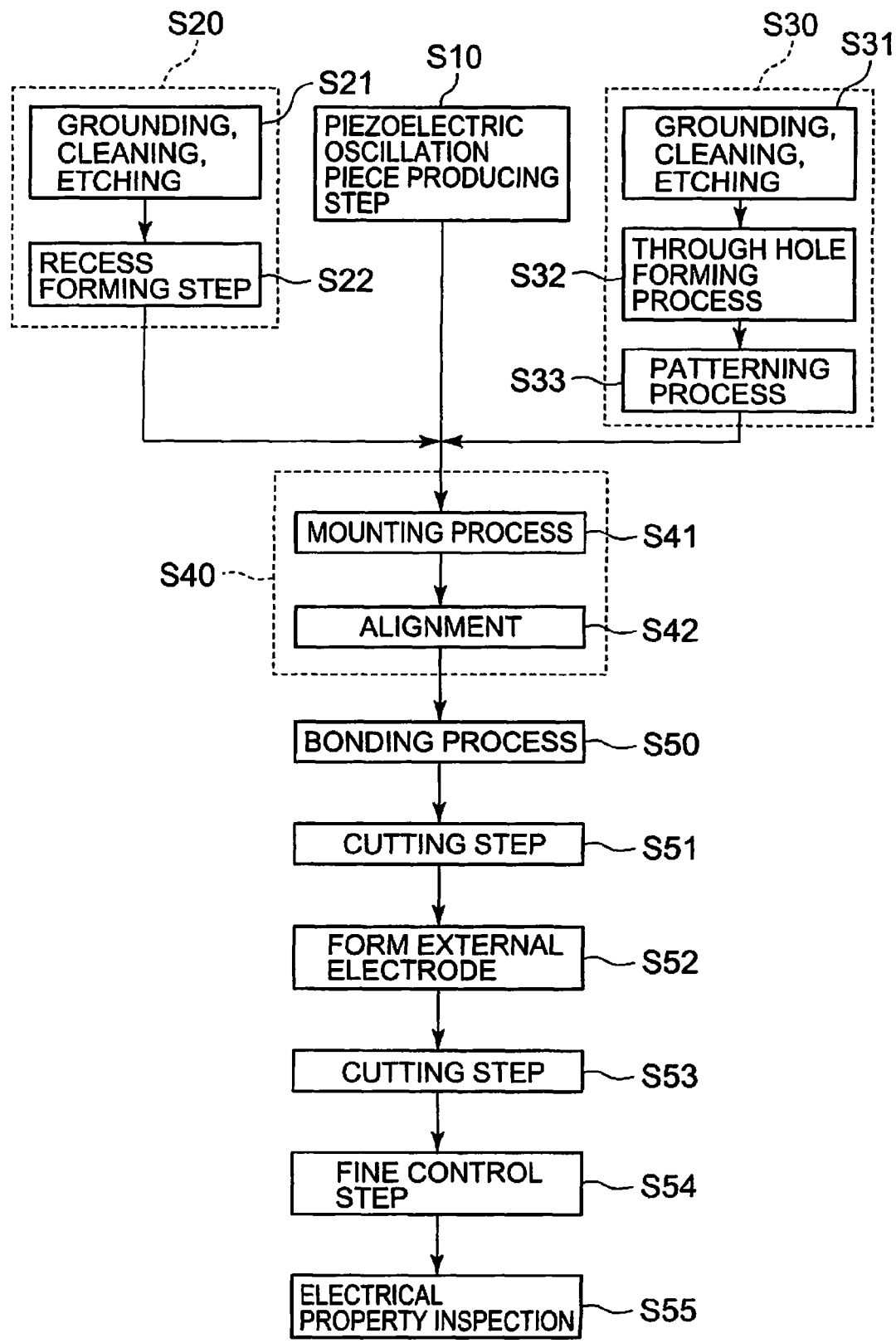
FIG. 8 is a flowchart illustrating a process flow during the manufacture of the piezoelectric vibrating reed shown in FIG. 1.

A method of manufacturing a plurality of the above-mentioned piezoelectric vibrators 1 at a time by using a base substrate wafer 40 and a lid substrate wafer 50 will be described below with reference to the flowchart shown in FIG. 8.

First, the piezoelectric vibrating reeds 4 shown in FIGS. 5 to 8 are formed by a piezoelectric vibrating reed making process (S10). Specifically, first, a Lambert raw stone of crystal is sliced at a predetermined angle so that wafers having a uniform thickness are formed. Subsequently, after the wafer is roughly worked by lapping, a work-affected layer is removed by etching. After that, mirror polishing working such as polishing is performed so that a wafer having a predetermined thickness is formed. Subsequently, after an appropriate treatment such as cleaning is performed on the wafer, the wafer is patterned so as to have the outline of the piezoelectric vibrating reed 4 by a photolithographic technique and the excitation electrodes 15, the extraction electrodes 19 and 20, the mount electrodes 16 and 17, and the weight metal films 21 are formed by the patterning and forming of a metal film. Accordingly, it may be possible to form a plurality of piezoelectric vibrating reeds 4.

Further, after the piezoelectric vibrating reeds 4 are made, the rough adjustment of a resonant frequency is performed. The rough adjustment of the resonant frequency is performed by irradiating the rough adjustment film 21a of the weight metal film 21 with laser light so that a part of the rough adjustment film is evaporated and the weight of the weight metal film is thus changed. Meanwhile, the fine adjustment for more accurately adjusting the resonant frequency is performed after mounting. This will be described below.

Figure 9:
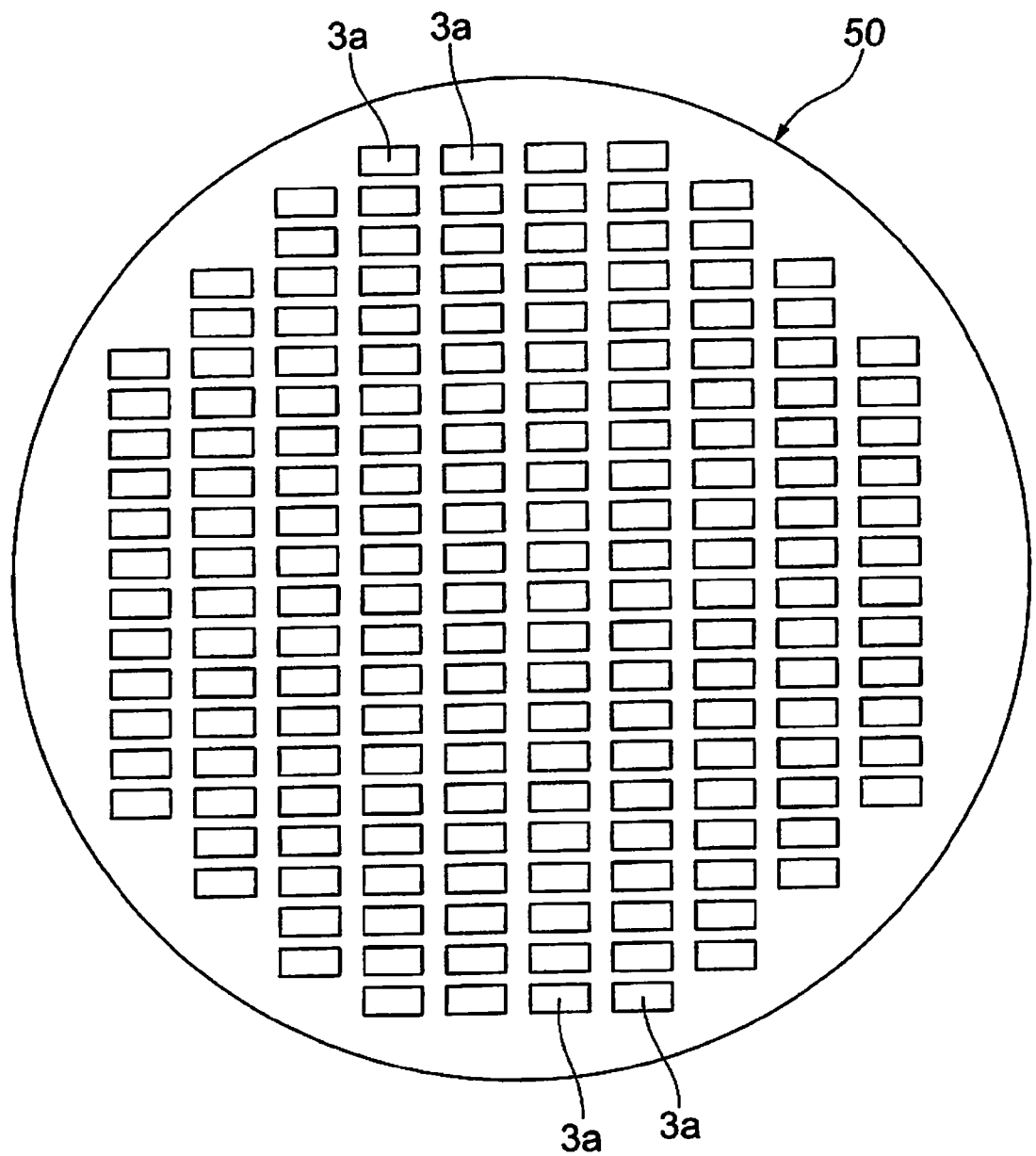
FIG. 9 is a view illustrating one process when a piezoelectric vibrator is manufactured according to the flowchart illustrated in FIG. 8, and is a view showing a state where a plurality of recesses is formed on a lid substrate wafer that is a material of a lid substrate.

After that, there is performed a first wafer making process (S20) for making the lid substrate wafer 50, which forms the lid substrate 3 later, up to a state immediately before the anodic bonding is performed. First, after soda-lime glass is polished up to a predetermined thickness and cleaned, as shown in FIG. 9, a disk-shaped lid substrate wafer 50 of which the outermost work-affected layer is removed by etching or the like is formed (S21). Then, there is performed a recess forming process (S22) for forming a plurality of recesses 3a for cavities on the bonding surface of the lid substrate wafer 50 in row and column directions by etching or the like. The first wafer making process is terminated at this time.

Subsequently, there is performed a second wafer making process (S30) for making the base substrate wafer 40, which forms the base substrate 2 later, up to a state immediately before the anodic bonding is performed. First, after soda-lime glass is polished up to a predetermined thickness and cleaned, a disk-shaped base substrate wafer 40 of which the outermost work-affected layer is removed by etching or the like is formed (S31).

Figure 10:
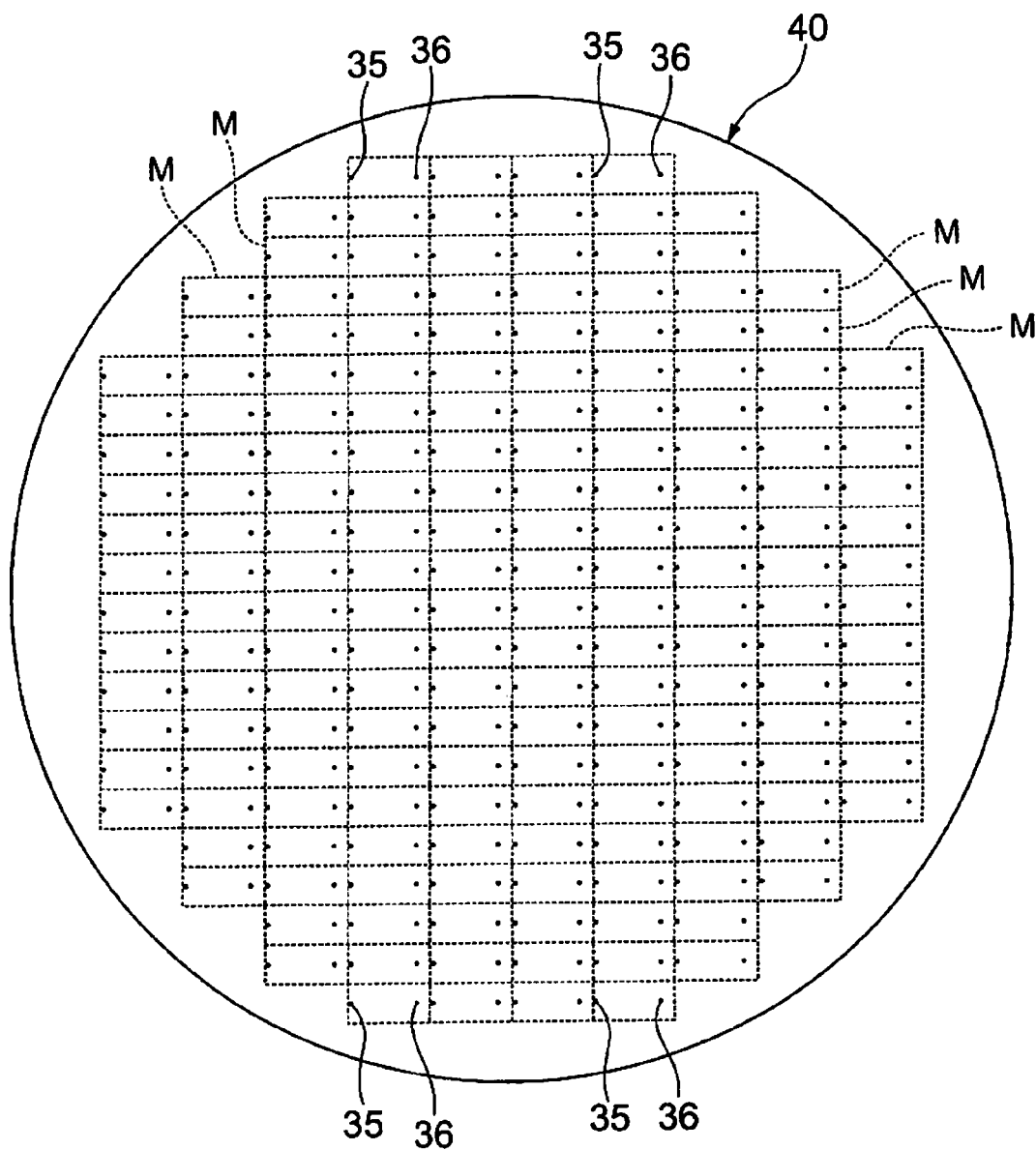
FIG. 10 is a view illustrating one process when a piezoelectric vibrator is manufactured according to the flowchart illustrated in FIG. 8, and is a view showing a state where a bonding layer, mounting layers, and extraction electrode layers are patterned on a base substrate wafer that is a material of a base substrate.

Then, there is performed a through hole forming process (S32) for forming a plurality of pairs of through holes 35 and 36 at the base substrate wafer 40 as shown in FIG. 10 by, for example, blasting. Meanwhile, dotted lines M shown in FIG. 10 are cutting lines along which cutting is performed in a cutting process to be performed later. In this case, the through holes 35 and 36 are formed so that the openings of the through holes are not opened to the inside of the recesses 3a and are opened to the outside of the recesses 3a when the lid substrate wafer 50 is superimposed.

Figure 11:
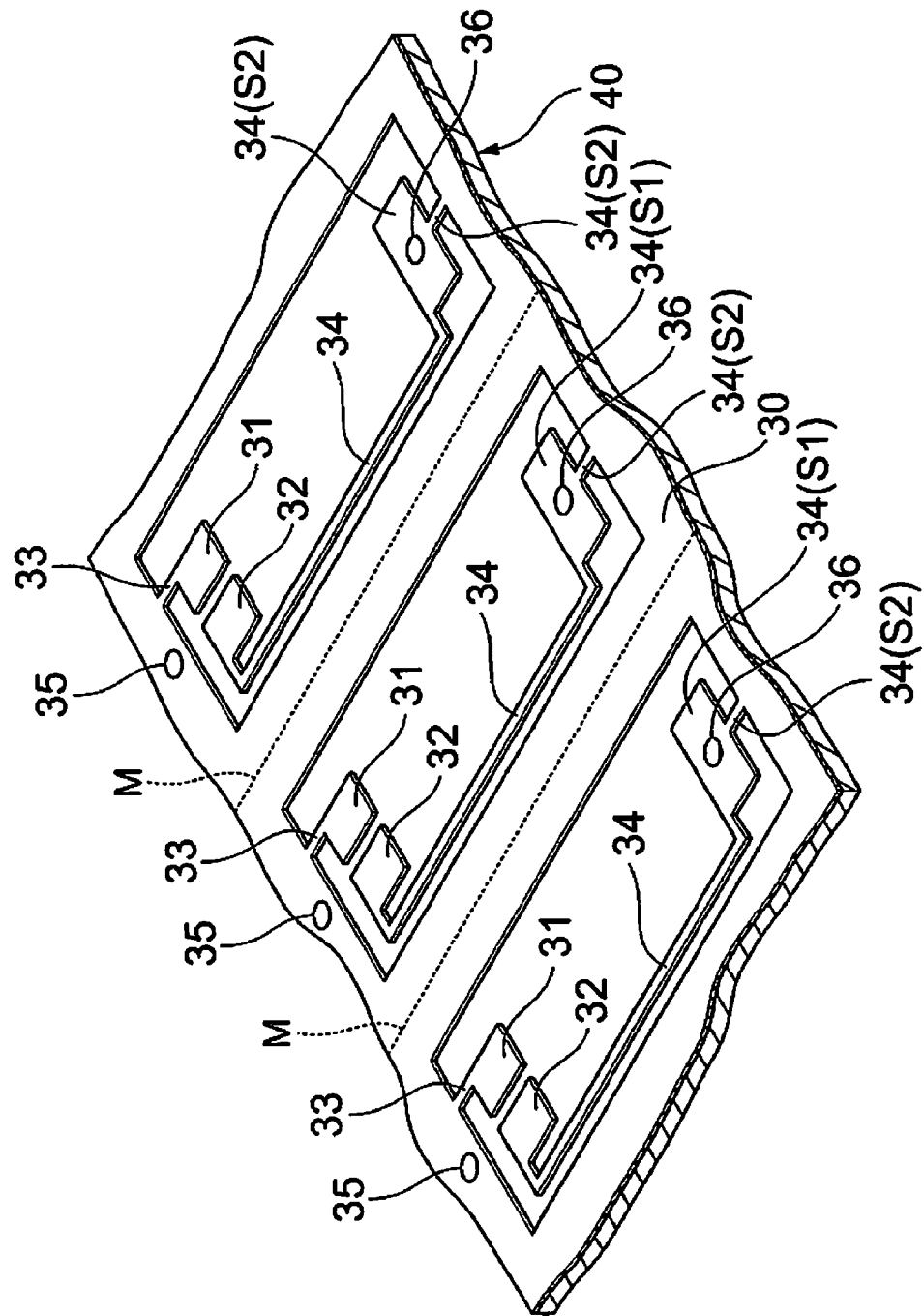
FIG. 11 is a view illustrating one process when a piezoelectric vibrator is manufactured according to the flowchart illustrated in FIG. 8, and is a view showing a state where a plurality of through holes are formed at a base substrate wafer that is a material of a base substrate.

After that, there is performed a patterning process (S33) for patterning the bonding layer 30, the pairs of mounting layers 31 and 32, and the pairs of extraction electrode layers 33 and 34 on the bonding surface of the base substrate wafer 40 with the same conductive material as shown in FIG. 11. Meanwhile, dotted lines M shown in FIG. 11 are cutting lines along which cutting is performed in a cutting process to be performed later.

In particular, when the bonding layer 30 is formed, a conductive material is patterned so as to pass over the opening of one through hole 35 while covering the peripheral portion of the opening of the one through hole. Accordingly, the peripheral portion of the opening of one through hole 35 is surrounded by the bonding layer 30. In addition, since patterning is performed after the through hole forming process, the bonding layer 30 slightly enters the inner surface of one through hole 35 (see FIGS. 14 and 16 to be described below).

Further, one extraction electrode layer 33 is patterned so as to directly and electrically connect one mounting layer 31 to the bonding layer 30 regardless of the through hole. Furthermore, the other extraction electrode layer 34 is patterned so as to electrically connect the other mounting layer 32 to the bonding layer 30 after passing over the opening of the other through hole while covering the peripheral portion of the opening of the other through hole 36. That is, the other extraction electrode layer 34 is formed so as to connect the area S1 to the bonding layer 30 through the above-mentioned area S2. Accordingly, when this process has been performed, all of the bonding layer 30, the pair of mounting layers 31 and 32, and the pair of extraction electrode layers 33 and 34 are electrically connected to one another. The second wafer making process is terminated at this time.

Meanwhile, the peripheral portion of the opening of the other through hole 36 is surrounded by the area S1 of the other extraction electrode layer 34. In addition, since patterning is performed after the through hole forming process, the other extraction electrode layer 34 slightly enters the inner surface of the other through hole 36 (see FIGS. 14 and 16 to be described below).

Then, there is performed a superimposing process (S40) for superimposing both the wafers 40 and 50 so to receive the piezoelectric vibrating reeds 4 in the cavities C, which are surrounded by the recesses 3a and both the wafers 40 and 50, after the plurality of made piezoelectric vibrating reeds 4 is mounted on the pairs of mounting layers 31 and 32, respectively.

First, there is performed a mounting process (S41) for mounting the plurality of made piezoelectric vibrating reeds 4 on the pairs of mounting layers 31 and 32 so that the piezoelectric vibrating reeds 4 are received in the respective recesses 3a formed on the base substrate wafer 40. Specifically, after the base portions 12 of the piezoelectric vibrating reeds 4 are placed on the pairs of mounting layers 31 and 32 that are formed in the respective recesses 3a, the base portions are mounted by a conductive adhesive or bump bonding. Accordingly, the piezoelectric vibrating reeds 4 are mechanically supported by the pairs of mounting layers 31 and 32 and the mount electrodes 16 and 17 are electrically connected to the extraction electrode layers 33 and 34.

After the mounting of the piezoelectric vibrating reeds 4 is terminated, the lid substrate wafer 50 is superimposed on the base substrate wafer 40. Further, while reference marks (not shown) are used as indexes, both the wafers 40 and 50 are aligned in position (S42). Accordingly, the mounted piezoelectric vibrating reeds 4 are received in the cavities C that are surrounded by the wafers 40 and 50 and the recesses 3a formed on the base substrate wafer 40, respectively.

Figure 12:
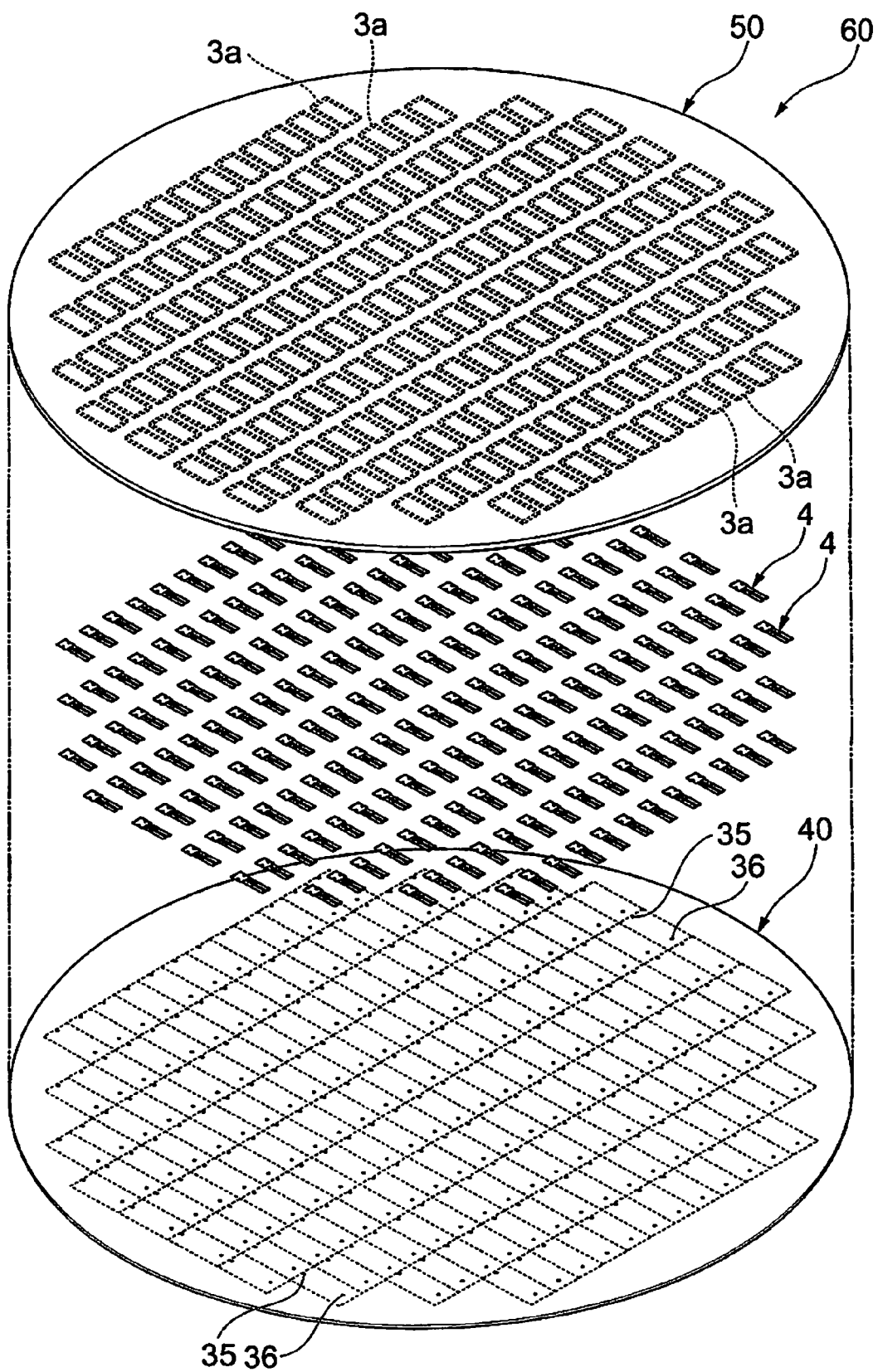
FIG. 12 is a view illustrating one process when a piezoelectric vibrator is manufactured according to the flowchart illustrated in FIG. 8, and is an exploded perspective view of a wafer where the base substrate wafer and the lid substrate wafer are anodically bonded to each other so that the piezoelectric vibrating reeds are in cavities.

After the superimposing process, there is performed a bonding process (S50) for anodically bonding the two superimposed wafers by applying a predetermined voltage in a predetermined temperature atmosphere after putting two superimposed wafers 40 and 50 in an anodic bonding apparatus (not shown). Specifically, a predetermined voltage is applied between the bonding layer 30 and the lid substrate wafer 50. Accordingly, an electrochemical reaction occurs on the interface between the bonding layer 30 and the lid substrate wafer 50, and the bonding layer and the lid substrate wafer come into close contact with each other and are anodically bonded to each other. Accordingly, it may be possible to seal the piezoelectric vibrating reed 4 in the cavity C, and to obtain a wafer 60 shown in FIG. 12 where the base substrate wafer 40 and the lid substrate wafer 50 are bonded to each other. Meanwhile, for the easy understanding of the drawing, the exploded wafer 60 is shown in FIG. 12. Further, the bonding layer 30, the mounting layers 31 and 32, and the extraction electrodes 19 and 20 are not shown.

Figure 13:
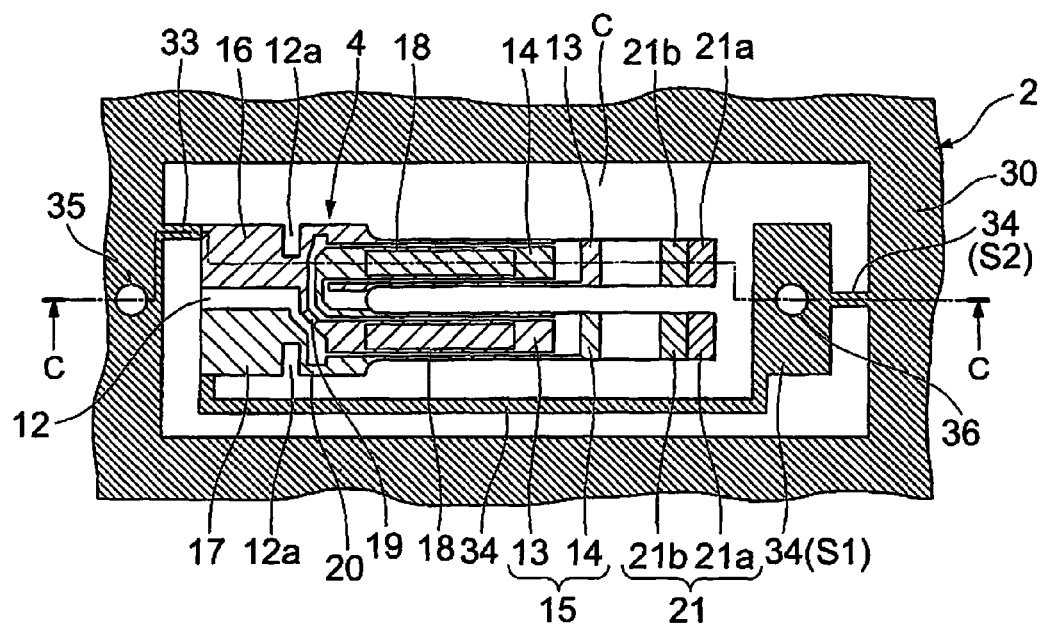
FIG. 13 is a view illustrating one process when a piezoelectric vibrator is manufactured according to the flowchart illustrated in FIG. 8, and is a view showing the patterning of the bonding layer, the mounting layers, and the extraction electrode layers at the time of anodic bonding.
Figure 14:
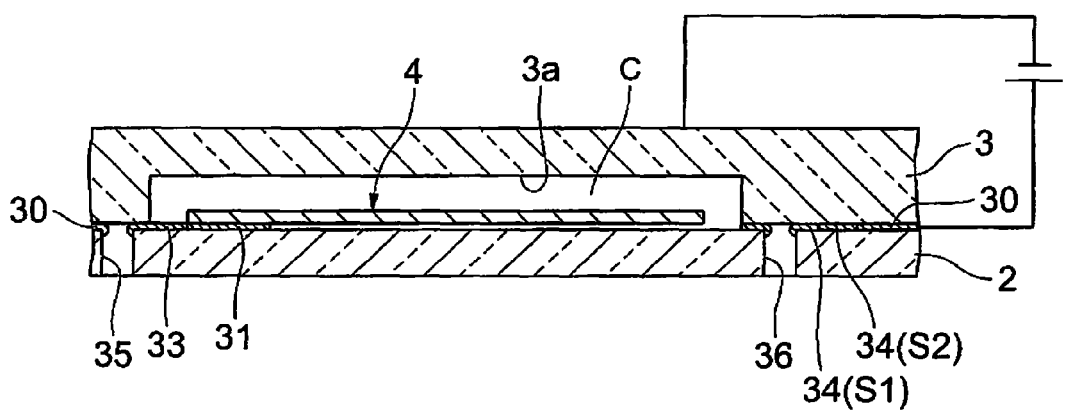
FIG. 14 is a cross-sectional view taken along a line C-C shown in FIG. 13.
Figure 15:
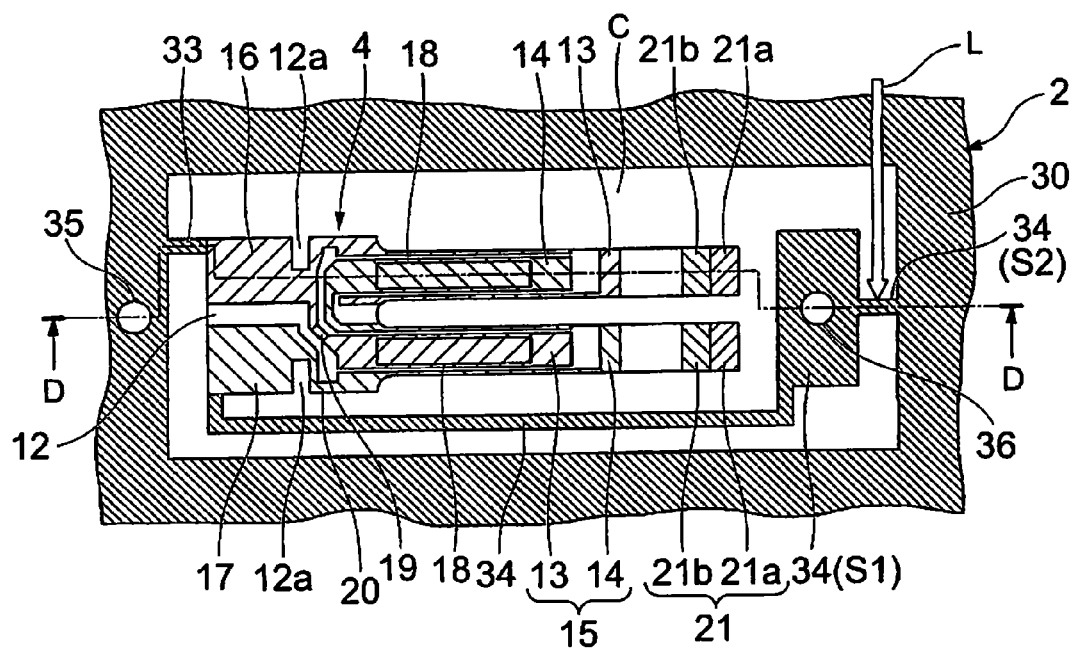
FIG. 15 is a view illustrating one process when a piezoelectric vibrator is manufactured according to the flowchart illustrated in FIG. 8, and is a view showing a state where the extraction electrode layers are being isolated by irradiating a part of the extraction electrode layers with laser light.

When the anodic bonding is performed, the bonding layer 30 is electrically connected to the pair of extraction electrode layers 33 and 34 as shown in FIGS. 13 and 14, so that a voltage is also applied to the pair of extraction electrode layers 33 and 34 during the application of a voltage. Accordingly, like the bonding layer 30, the area S1 of the other extraction electrode layer 34 comes into close contact with the lid substrate wafer 50 by anodic bonding. For this reason, the pair of through holes 35 and 36 and the peripheral portions of the openings thereof are reliably sealed. Therefore, airtightness in the cavity C is not impaired through the through holes 35 and 36.

In particular, since the bonding layer 30 is previously electrically connected to the pair of extraction electrode layers 33 and 34 by the patterning process, there is no concern that sealing in the cavity C becomes unreliable as in the method of applying a voltage through the conductive films formed on the inner surfaces of the through holes 35 and 36 in the related art. That is, since anodic bonding is performed without affecting the existence of the through holes 35 and 36, it may be possible to reliably perform bonding.

In addition, it may be possible to apply a voltage to all of the pairs of extraction electrode layers 33 and 34 formed on the base substrate wafer 40 by only applying a voltage to the bonding layer 30. Accordingly, even though the wafer is bent, it may be possible to uniformly bond the lid substrate wafer 50 to the base substrate wafer 40 over the entire surfaces of the wafers. Moreover, since the application of a voltage is simple in comparison with the related art, it may be possible to apply a voltage in a short time. As a result, it may be possible to improve manufacturing efficiency.

After the above-mentioned anodic bonding is terminated, there is performed an isolating process (S51) for electrically isolating the other extraction electrode layers 34 from the bonding layer 30 in the middle. That is, as shown FIGS. 15 and 16, the area S2 of the other extraction electrode layer 34, which is formed between the bonding layer 30 and the opening of the other through hole 36, is irradiated with laser light L, so that the area S2 is cut. Accordingly, the other extraction electrode layer 34 is isolated in the middle, and is electrically isolated from the bonding layer 30. The other extraction electrode layer 34 and the other mounting layer 32 become electrically independent of the bonding layer 30 by this process.

Meanwhile, the area S2 is evaporated during the irradiation of laser light L, so that the isolation is performed. However, evaporated ingredients are diffused in a small gap formed between both the wafers 40 and 50 as shown by an arrow of FIG. 15. Accordingly, it may be possible to reliably and smoothly perform the isolation.

Subsequently, there is performed an external electrode forming process (S52) for forming the external electrodes 37 and 38 by closing the pairs of through holes 35 and 36 with a conductive material. Specifically, after a film is formed in the through holes 35 and 36 with a conductive material by a sputtering method, the conductive material forming the film is grown by a plating method. In this case, the external electrodes 37 and 38 are formed so as to be exposed to the lower surface of the base substrate wafer 40. In particular, the openings of the through holes 35 and 36 are surrounded by the bonding layer 30 and the other extraction electrode layer 34, respectively. Accordingly, it may be possible to electrically connect the external electrodes 37 and 38 to the bonding layer 30 and the other extraction electrode layer 34 by this process, respectively.

Figure 16:
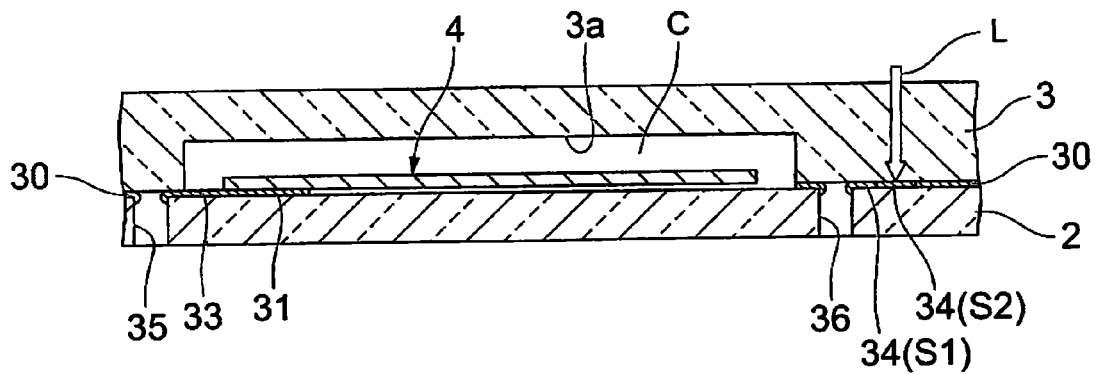
FIG. 16 is a cross-sectional view taken along a line D-D shown in FIG. 15.

In addition, as shown in FIG. 16, a part of the bonding layer 30 enters one through hole 35 and a part of the other extraction electrode layer 34 enters the other through hole 36. For this reason, it may be possible to more reliably make the electric conductivity between the external electrode 37 and the bonding layer 30 and the electric conductivity between the external electrode 38 and the other extraction electrode layer 34.

Then, there is performed a cutting process (S53) for cutting the bonded wafer 60 into small pieces along the cutting lines M shown in FIGS. 10 and 11. As a result, it may be possible to manufacture a plurality of surface mounted piezoelectric vibrators 1, of which one is shown in FIG. 1 and the piezoelectric vibrating reed 4 is sealed in the cavity C formed between the base substrate 2 and lid substrate 3 anodically bonded to each other, at a time.

After that, there is performed a fine adjustment process (S54) for making the frequency of each of the piezoelectric vibrators 1 be in a predetermined range by finely adjusting the frequency of each of the piezoelectric vibrators. Specifically, a voltage is applied to the external electrodes 37 and 38, so that the piezoelectric vibrating reeds 4 are vibrated. Further, while the frequency is measured, laser light is irradiated from the outside through the lid substrate 3, thereby evaporating the fine adjustment film 21b of the weight metal film 21. Accordingly, the weight of the ends of the pair of vibration arm portions 10 and 11 is changed. As a result, it may be possible to finely adjust the frequency of the each of the piezoelectric vibrating reeds 4 so that the frequency of the piezoelectric vibrating reeds is in a predetermined nominal frequency range.

After that, an internal electronic characteristic inspection is performed (S55). That is, the drive level characteristics, the resonance resistance value, the resonant frequency (excitation power dependence of resonance resistance value and resonant frequency) and the like of the piezoelectric vibrating reeds 4 are measured and checked. Further, insulation resistance characteristics and the like are also checked. Furthermore, the appearances of the piezoelectric vibrators 1 are finally inspected to finally check dimension, quality, and the like. As a result, the manufacture of the piezoelectric vibrators 1 is terminated.

In particular, according to the above-mentioned manufacturing method, it may be possible to more efficiently manufacture the piezoelectric vibrator 1 that can reliably seal the cavity C and secure electric conductivity between the piezoelectric vibrating reed 4 and the external electrodes 37 and 38 by using the through holes 35 and 36. Therefore, it may be possible to manufacture the piezoelectric vibrator 1 that has high quality and high reliability, and to reduce the manufacturing cost of the piezoelectric vibrator.

An embodiment of an oscillator according to the invention will be described below with reference to FIG. 17.

Figure 17:
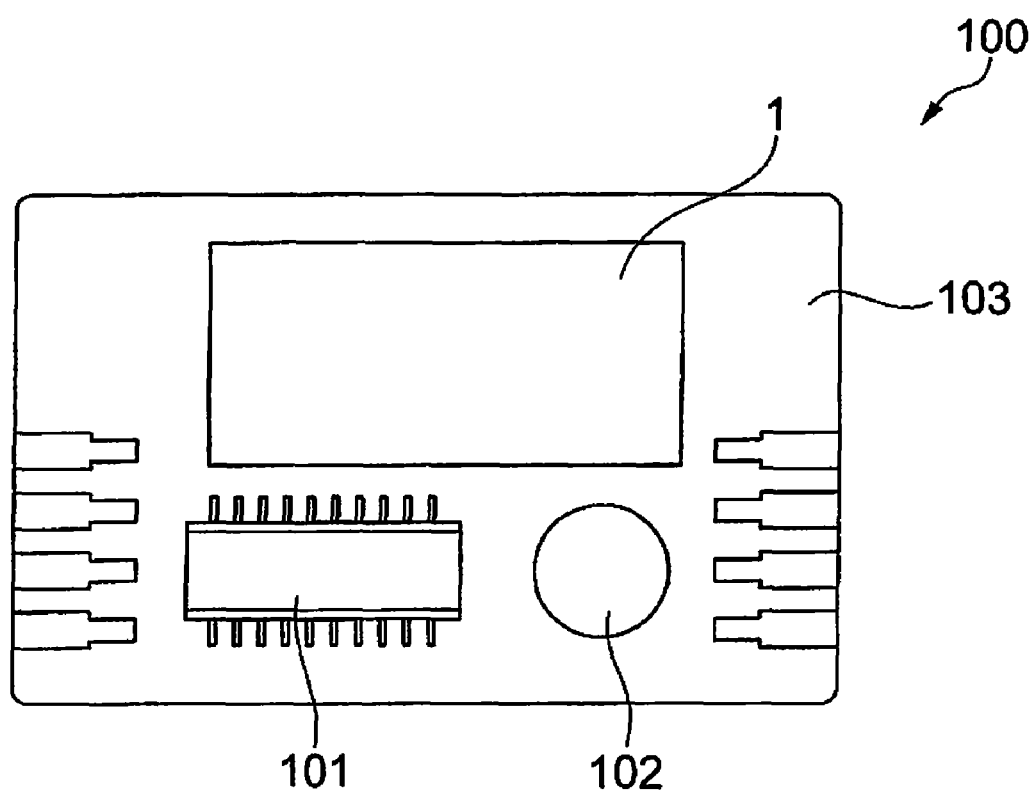
FIG. 17 is a view showing the configuration of an embodiment of an oscillator according to the invention.

As shown in FIG. 17, an oscillator 100 according to this embodiment includes the piezoelectric vibrator 1 as an oscillating component that is electrically connected to an integrated circuit 101. The oscillator 100 includes a substrate 103 on which an electronic component 102 such as a capacitor is mounted. The integrated circuit 101 for the oscillator is mounted on the substrate 103, and the piezoelectric vibrating reed 4 of the piezoelectric vibrator 1 is mounted near the integrated circuit 101 on the substrate. The electronic component 102, the integrated circuit 101, and the piezoelectric vibrator 1 are electrically connected to one another by wiring patterns (not shown). Meanwhile, each of the components is molded with a resin (not shown).

When a voltage is applied to the piezoelectric vibrator 1 of the oscillator 100 having the above-mentioned structure, the piezoelectric vibrating reed 4 of the piezoelectric vibrator 1 vibrates. The vibration is converted into an electrical signal due to the piezoelectric characteristics of the piezoelectric vibrating reed 4, and is input to the integrated circuit 101 as an electrical signal. The input electrical signal is subjected to various processes by the integrated circuit 101 and is output as a frequency signal. Accordingly, the piezoelectric vibrator 1 functions as an oscillating component.

Further, it is possible to add a function of controlling date or time of the operation of the device or an external device other than a single-function oscillator for a clock and the like or a function of providing time or a calendar by selectively setting the structure of the integrated circuit 101, for example, an RTC (real time clock) module and the like in compliance with demands.

As described above, the oscillator 100 according to this embodiment includes the piezoelectric vibrator 1 that has high reliability, high quality, and low manufacturing cost. Accordingly, it may also be possible to improve the quality of the oscillator 100 and to reduce the manufacturing cost of the oscillator. In addition to this, it may be possible to obtain a stable and accurate frequency signal over a long period of time.

Figure 18:
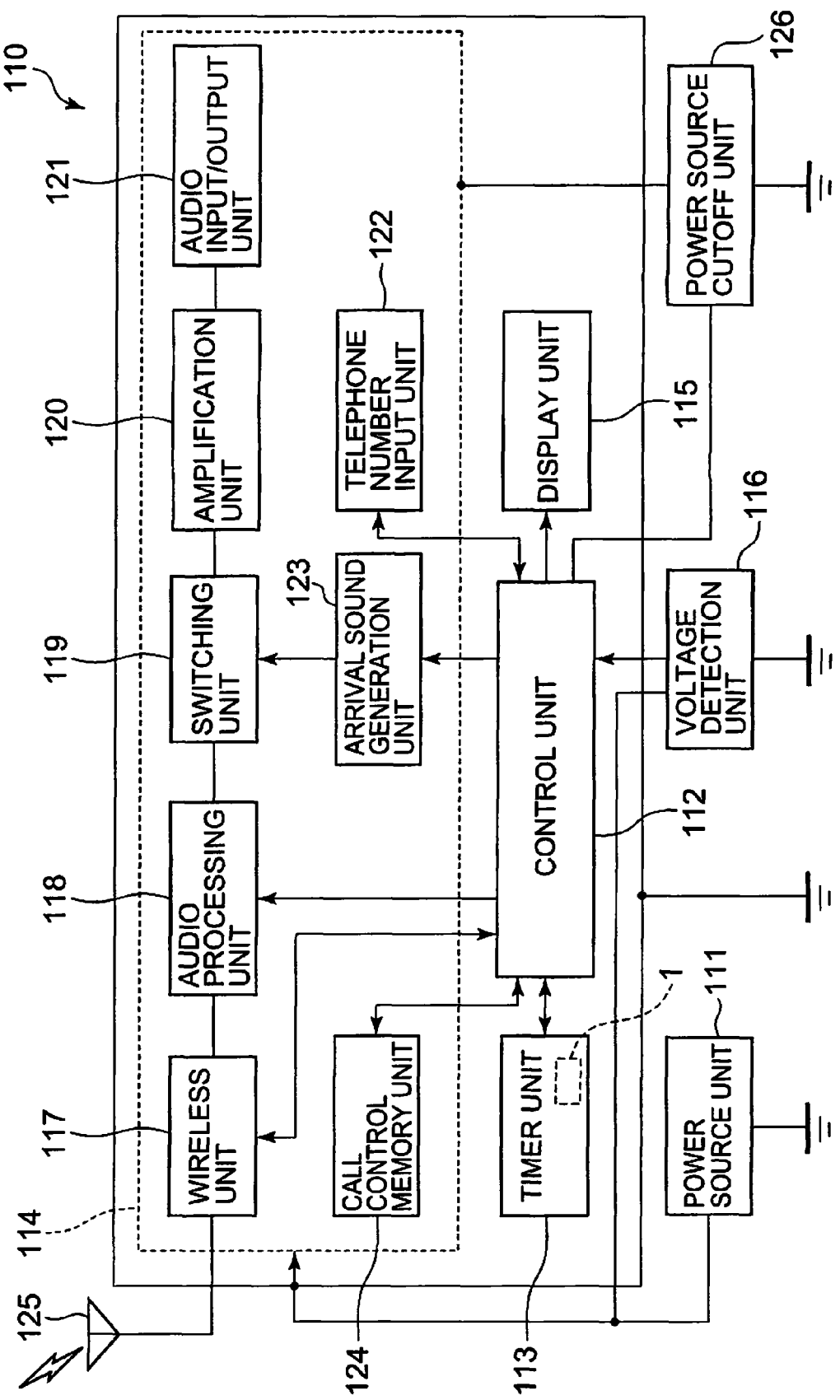
FIG. 18 is a view showing the configuration of an embodiment of an electronic device according to the invention.

An embodiment of an electronic device according to the invention will be described with reference to FIG. 18. Meanwhile, a portable information device 110 including the above-mentioned piezoelectric vibrator 1 will be exemplified as the electronic device. First, the portable information device 110 according to this embodiment is typified by, for example, a cell phone, and is obtained by developing and improving a watch in the related art. The portable information device is similar to a watch in appearance, a liquid crystal display is disposed at a portion of the portable information device corresponding to a dial, and the portable information device can display current time and the like on a screen of the liquid crystal display. Further, when the portable information device is used as a communication device, the portable information device may be used to perform communication like the cell phone in the related art through a speaker and a microphone that are built in an inner portion of a band after being separated from a wrist. However, the size and weight of the portable information device are much smaller than those of the cell phone in the related art.

The structure of the portable information device 110 according to this embodiment will be described below. As shown in FIG. 18, the portable information device 110 includes the piezoelectric vibrator 1 and a power supply unit 111 for supplying power. The power supply unit 111 is formed of, for example, a lithium secondary battery. A control unit 112 that performs various kinds of control, a clock unit 113 that counts time and the like, a communication unit 114 that communicates with the outside, a display unit 115 that displays various kinds of information, and a voltage detection unit 116 that detects voltages of the respective functional units are connected in parallel to the power supply unit 111. Further, power is supplied to each of the functional units by the power supply unit 111.

The control unit 112 controls the operation of the entire system, such as the transmission and reception of voice data and the measurement or display of the current time, by controlling the respective functional units. Further, the control unit 112 includes a ROM where a program is written in advance, a CPU that reads out and executes the program written in the ROM, a RAM that is used as a work area of the CPU, and the like.

The clock unit 113 includes an integrated circuit and the piezoelectric vibrator 1. An oscillation circuit, a register circuit, a counter circuit, an interface circuit, and the like are built in the integrated circuit. When a voltage is applied to the piezoelectric vibrator 1, the piezoelectric vibrating reed 4 vibrates. The vibration is converted into an electrical signal due to the piezoelectric characteristics of crystal, and is input to the oscillation circuit as an electrical signal. The output of the oscillation circuit is binarized and counted by the register circuit and the counter circuit. Further, the clock unit transmits/receives a signal to/from the control unit 112 through the interface circuit. Current time, current date, calendar information, or the like is displayed on the display unit 115.

The communication unit 114 has the same function as the cell phone in the related art. The communication unit includes a wireless part 117, a voice processing part 118, a switching part 119, an amplifying part 120, a voice input/output part 121, a phone number input part 122, a ringtone generating part 123, and a call control memory part 124.

The wireless part 117 transmits/receives various data such as voice data to/from a base station through an antenna 125. The voice processing part 118 encodes and decodes a voice signal that is input from the wireless part 117 or the amplifying part 120. The amplifying part 120 amplifies a signal, which is input from the voice processing part 118 or the voice input/output part 121, up to a predetermined level. The voice input/output part 121 is formed of a speaker or a microphone or the like, and amplifies a ringtone or a received voice or collects a voice.

Further, the ringtone generating part 123 generates a ringtone in accordance with a call from a base station. The switching part 119 switches the amplifying part 120, which is connected to the voice processing part 118, to the ringtone generating part 123 when a call is received, so that the ringtone generated by the ringtone generating part 123 is output to the voice input/output part 121 through the amplifying part 120.

Meanwhile, the call control memory part 124 stores a program that is related to the outgoing/incoming call control of communication. Further, the phone number input part 122 includes number keys corresponding to, for example, 0 to 9 and other keys. When these number keys or the like are pressed down, the phone number of a callee is input.

When the voltage, which is applied to each functional unit such as the control unit 112 by the power supply unit 111, is lower than a predetermined value, the voltage detection unit 116 detects the voltage drop and notifies the control unit 112 of the voltage drop. The predetermined voltage value in this case is a value that is preset as the minimum voltage required for stably operating the communication unit 114, and is, for example, about 3 V. The control unit 112, which receives a notice of the voltage drop from the voltage detection unit 116, prohibits the operation of the wireless part 117, the voice processing part 118, the switching part 119, and the ringtone generating part 123. In particular, it is essential to stop the operation of the wireless part 117 having large power consumption. Further, a message that the communication unit 114 is not available due to the lack of the battery power is displayed on the display unit 115.

That is, the operation of the communication unit 114 is prohibited by the voltage detection unit 116 and the control unit 112, and a message that the operation of the communication unit is prohibited by the voltage detection unit and the control unit may be displayed on the display unit 115. The display may be a short message. However, an "x" (cross) mark may be displayed at a phone icon, which is displayed at an upper portion on the display screen of the display unit 115, as an intuitive display.

Meanwhile, if there is provided a power cutting-off unit 126 that can selectively cut off power applied to parts related to a function of the communication unit 114, it may be possible to more reliably stop the function of the communication unit 114.

As described above, the portable information device 110 according to this embodiment includes the piezoelectric vibrator 1 that has high reliability, high quality, and low manufacturing cost. Accordingly, it may also be possible to improve the quality of the portable information device 110 and to reduce the manufacturing cost thereof. In addition to this, it may be possible to display a stable and accurate clock information over a long period of time.

An embodiment of a radio clock according to the invention will be described with reference to FIG. 19.

Figure 19:
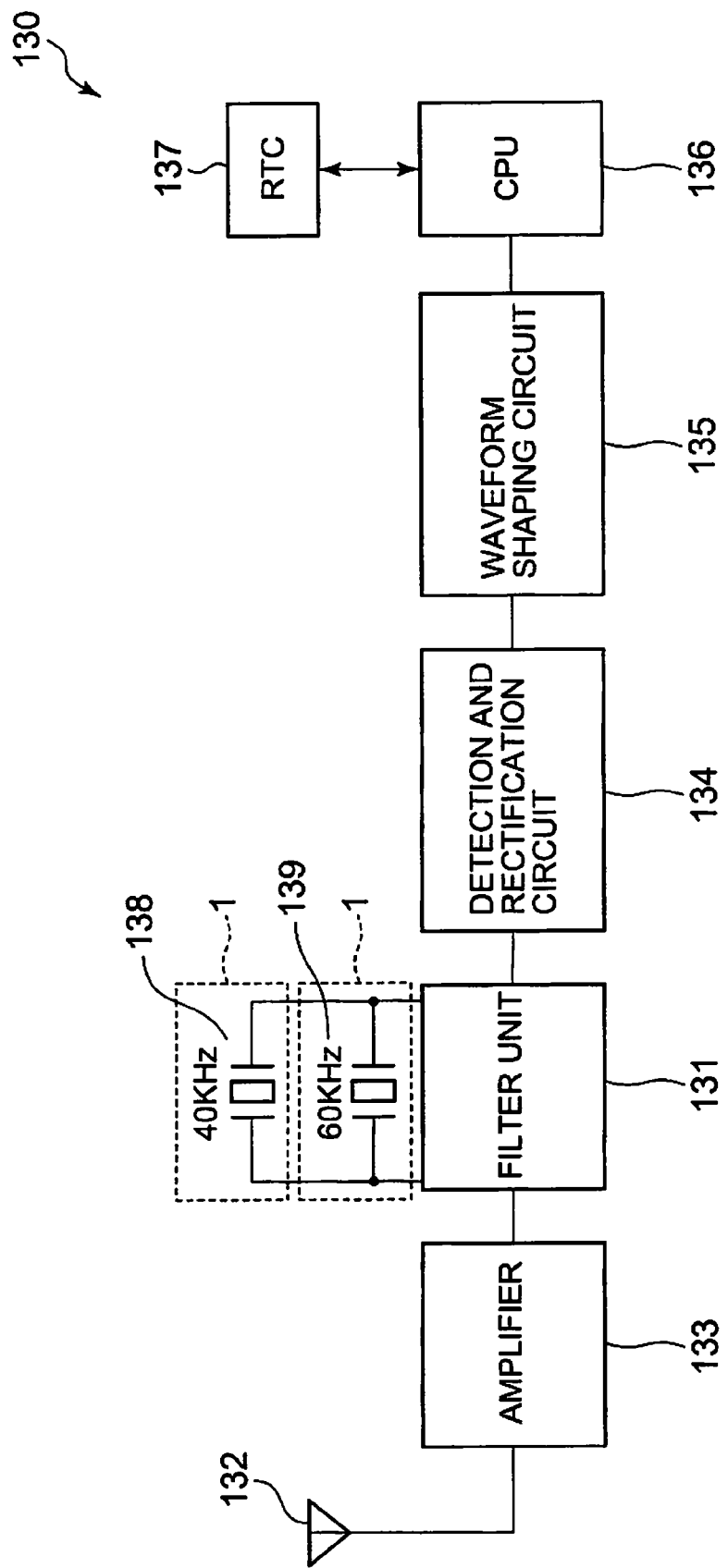
FIG. 19 is a view showing the configuration of an embodiment of a radio clock according to the invention.

As shown in FIG. 19, a radio clock 130 according to this embodiment includes the piezoelectric vibrator 1 that is electrically connected to a filter unit 131. The radio clock is a clock that has a function of receiving standard waves including clock information, a function of automatically correcting the standard waves at a correct time, and a function of displaying the standard waves.

In Japan, transmission stations (transmitter station) for transmitting standard waves are located in Fukushima-ken (40 kHz) and Saga-ken (60 kHz) and transmit standard waves. A long wave corresponding to 40 kHz or 60 kHz has a property of propagating on the surface of the ground and a property of propagating while the long wave is reflected from an ionization layer and the surface of the ground. Accordingly, the propagation range of the long wave is wide, and the above-mentioned two transmission stations cover the entire area of Japan.

The functional structure of the radio clock 130 will be described in detail below.

An antenna 132 receives standard waves that are long waves corresponding to 40 kHz or 60 kHz. The standard wave, which is a long wave, is a wave that is obtained by performing AM modulation of time information, which is called time codes, in a carrier wave corresponding to 40 kHz or 60 kHz. The reception standard wave, which is a long wave, is amplified by the amplifier 133, and is filtered and synchronized by the filter unit 131 including a plurality of piezoelectric vibrators 1.

The piezoelectric vibrators 1 of this embodiment include crystal vibrator parts 138 and 139 having resonant frequencies of 40 kHz and 60 kHz, which are equal to the carrier frequencies, respectively.

Further, the filtered signal having a predetermined frequency is detected and demodulated by a detection/rectification circuit 134. Subsequently, the time codes are extracted through a wave-shaping circuit 135, and are counted by a CPU 136. The CPU 136 reads out information, such as the current year, accumulated days, a day of the week, and time. The read information is reflected in the RTC 138, so that correct time information is displayed.

Since the carrier wave corresponds to 40 kHz or 60 kHz, a vibrator having the above-mentioned tuning-fork type structure is preferably used as each of the crystal vibrator parts 138 and 139.

Meanwhile, the case of Japan has been exemplified above, but the frequency of the standard wave, which is a long wave, varies abroad. For example, a standard wave corresponding to 77.5 KHz is used in Germany. Accordingly, when a radio clock 130, which can be used even abroad, is to be built in a portable device, there is needed a piezoelectric vibrator 1 having a frequency different from a frequency of the case of Japan.

As described above, the radio clock 130 according to this embodiment includes the piezoelectric vibrator 1 that has high reliability, high quality, and low manufacturing cost. Accordingly, it may also be possible to improve the quality of the radio clock 130 and to reduce the manufacturing cost thereof. In addition to this, it may be possible to count a stable and accurate time over a long period of time.

Meanwhile, the technical scope of the invention is not limited to the above-mentioned embodiments, and various modifications may be made to the invention without departing from the scope of the invention.

Figure 20:
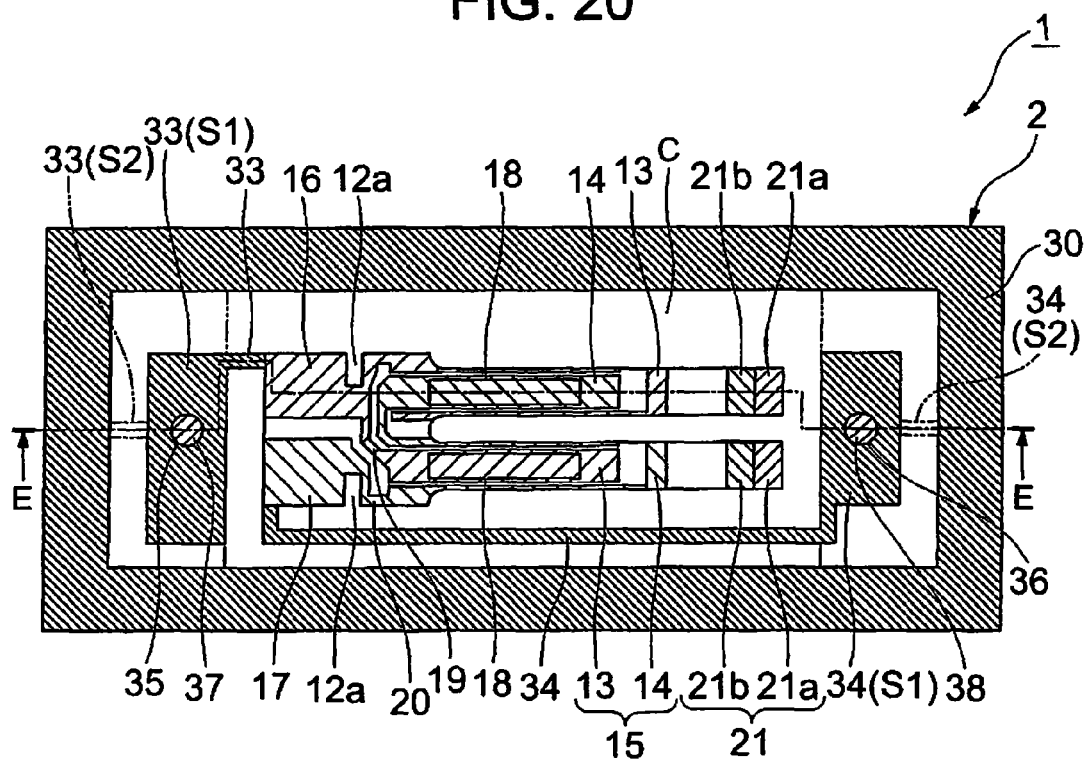
FIG. 20 is a view showing a modification of a piezoelectric vibrator according to the invention, and is a view showing a piezoelectric vibrating reed from the upper side when a lid substrate is removed.
Figure 21:
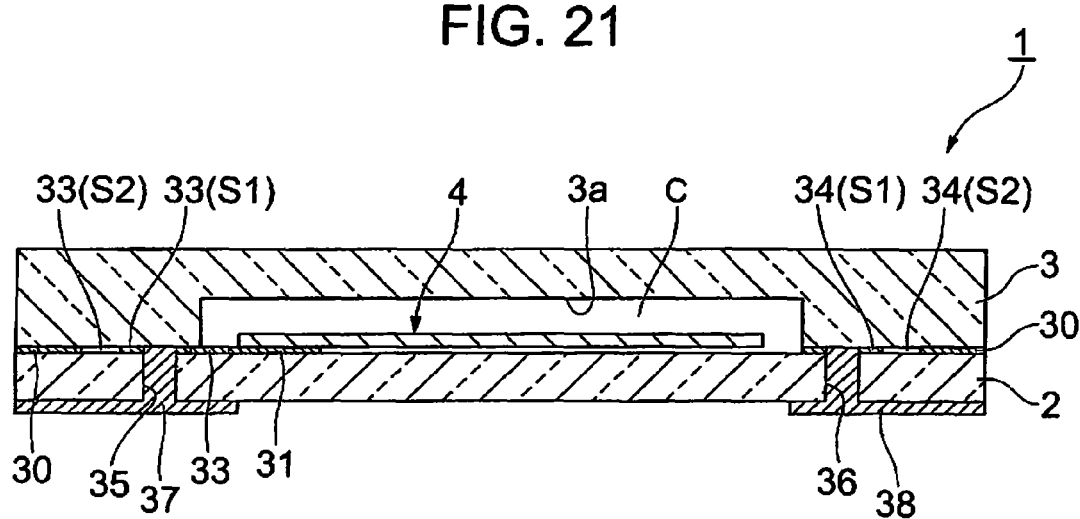
FIG. 21 is a cross-sectional view taken along a line E-E shown in FIG. 20.
Figure 22:
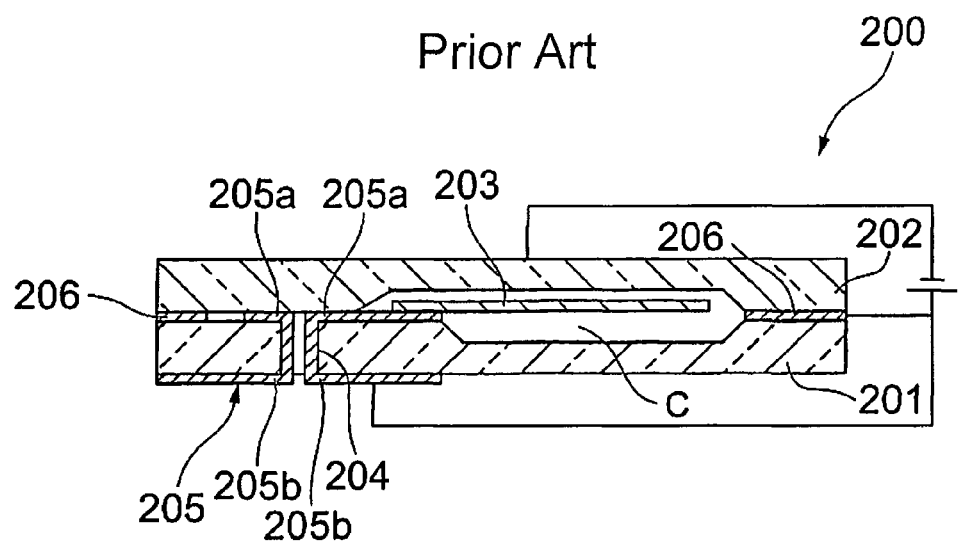
FIG. 22 is a cross-sectional view showing an example of a piezoelectric vibrator in the related art.
Figure 23:
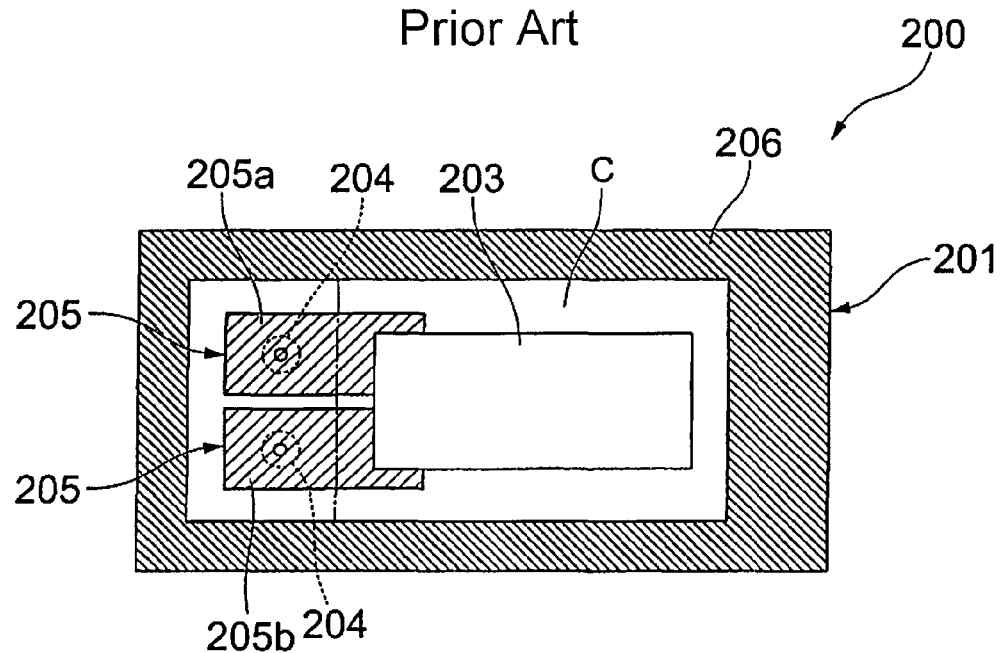
FIG. 23 is a view showing the internal structure of the piezoelectric vibrator shown in FIG. 22, and is a view showing a piezoelectric vibrating reed from the upper side when a lid substrate is removed.
Figure 24:
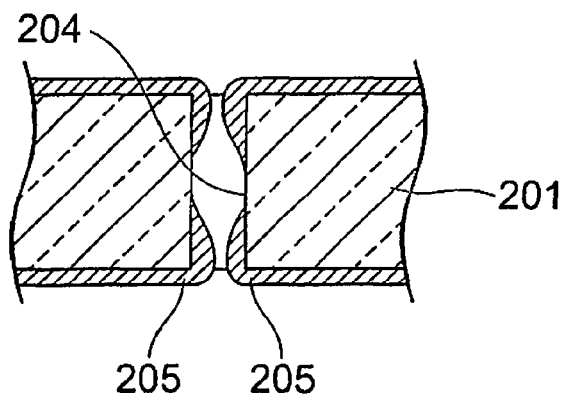
FIG. 24 is a partial enlarged view of the piezoelectric vibrator shown in FIG. 22, and is a view showing a state of a conductive film that is formed on the inner surface of the through hole.
Figure 25:
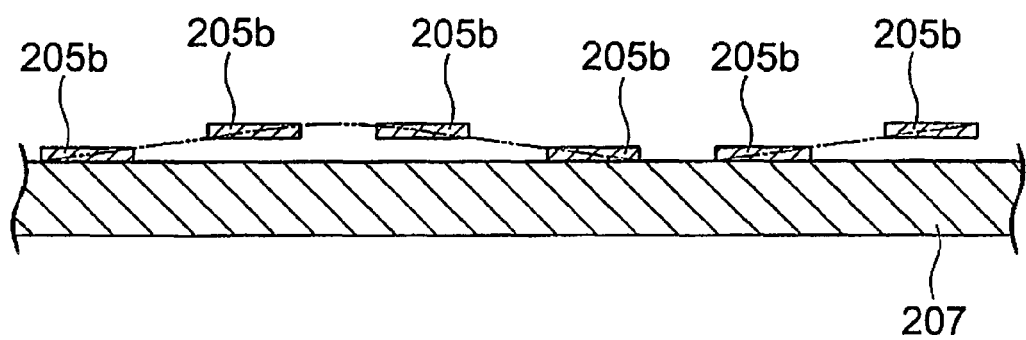
FIG. 25 is a view illustrating one process when the piezoelectric vibrator shown in FIG. 22 is manufactured, and is a view showing a state where a plurality of external electrodes is formed on a base substrate wafer that is a material of a base substrate and the wafer is then placed on a flat plate-shaped electrode.

For example, in the above-mentioned embodiment, one through hole 35 has been formed so that the opening of the one through hole is opened to the bonding layer 30. However, as shown in FIGS. 20 and 21, like the other through hole 36, one through hole 35 may be formed so that the opening of the one through hole 35 is exposed to the middle of one extraction electrode layer 33. In this case, in the isolating process, like the other extraction electrode layer 34, the area S2, which is formed between the bonding layer 30 and the area S1 where the opening of the through hole 35 is formed, may be irradiated with the laser light L so that the area S2 is cut. Even in this case, it may be possible to obtain the same advantages as those of the above-mentioned embodiment.

However, like the above-mentioned embodiment, it may be possible to make the length of one extraction electrode layer 33 be very short by forming one through hole 35 at the bonding layer 30. Accordingly, it may be possible to make the design of the piezoelectric vibrator be compact and to reduce the size of the piezoelectric vibrator 1.

What is claimed is:

1. A method for producing piezoelectric vibrators, comprising:
   (a) defining a plurality of first substrates on a first wafer and a plurality of second substrates on a second wafer;
   (b) forming a pair of through-holes in respective at least some of the first substrates on the first wafer, wherein the pair of through-holes are formed in a contact area defined along a periphery of the first substrate;
   (c) patterning, on respective at least some of the through-holed first substrates on the first wafer, a conductive layer which comprises a conductive loop extensive within the contact area to surround only one of the through-holes, and a first and a second electrodes formed inside the conductive loop in electrical connection with the conductive loop, the second electrode being electrically connected to the conductive loop via a bridge and extensive to surround only the other of the through-holes;
   (d) layering the first and second wafers such that at least some of the first substrates substantially coincide respectively with at least some of the corresponding second substrates, with a piezoelectric vibrating strip being secured in respective at least some of the coinciding first and second substrate pairs, wherein the coinciding first and second substrates are layered in contact with each other over the contact area;
   (e) anodically bonding a respective at least some of the coinciding first and second substrate pairs which each include the conductive layer patterned therein, wherein the conductive layer functions as a bonding layer for bonding the first and second substrate together so that the pair of through-holes formed in the first substrate are air-tightly closed by the second substrate;
   (f) after step (e), cutting the bridge in respective at least some of the bonded first and second substrate pairs to electrically isolate the second electrode from the conductive loop; and
   (g) after step (f), cutting off from the first and second wafers a respective at least some of the bonded first and second substrate pairs whose bridge is cut.

2. The method according to claim 1, further comprising before step (d), adjusting a resonance frequency of at least some of the piezoelectric vibrating strips before the strips are placed between the first and second substrates.

3. The method according to claim 1, further comprising before step (d), forming a recess in a respective at least some of at least one of the first substrates and the second substrates to create a cavity between the bonded first and second substrates for storage of the piezoelectric vibrating strip therein.

4. The method according to claim 1, wherein step (f) comprises irradiating a laser to the bridge from outside of the bonded substrates.

5. The method according to claim 1, further comprising before step (g),
(h) filling the through-holes from the outside to form external electrodes to at least some of the bonded first and second substrate pairs.

6. The method according to claim 5, wherein step (h) comprises sputtering a conductive film inside the respective through-holes and growing the conductive film to fill the respective through-holes.

7. The method according to claim 5, wherein step (h) is performed after step (f).

8. The method according to claim 1, further comprising after step (g)
(i) supplying electricity to a respective at least some of the bonded first and second substrate pairs which each include the conductive layer patterned therein via the first and second electrodes to vibrate the piezoelectric vibrating strip inside and detecting a frequency of the vibrating piezoelectric vibrating strip; and
(j) changing a weight of a respective at least some of the piezoelectric vibrating strips to adjust the detected frequency of the piezoelectric vibrating strip.

9. The method according to claim 7, wherein step (j) comprises irradiating a laser from the outside to partially removing an adjustable weight of the piezoelectric vibrating strip.

* * * * *

UNITED STATES PATENT AND TRADEMARK OFFICE
CERTIFICATE OF CORRECTION

| | | |
|---|---|---|
| PATENT NO. | : 8,020,264 B2 | Page 1 of 1 |
| APPLICATION NO. | : 12/794180 | |
| DATED | : September 20, 2011 | |
| INVENTOR(S) | : Kiyoshi Aratake et al. | |

It is certified that error appears in the above-identified patent and that said Letters Patent is hereby corrected as shown below:

<u>On the Title Page</u>

In the left column, item (54), before "METHOD OF MANUFACTURING A PIEZOELECTRIC VIBRATOR" insert --A--.

In column 1, in the title, before "METHOD OF MANUFACTURING A PIEZOELECTRIC VIBRATOR" insert --A--.

Signed and Sealed this

Seventeenth Day of April, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,020,264 B2 | Page 1 of 1 |
| APPLICATION NO. | : 12/794180 | |
| DATED | : September 20, 2011 | |
| INVENTOR(S) | : Kiyoshi Aratake et al. | |

It is certified that error appears in the above-identified patent and that said Letters Patent is hereby corrected as shown below:

Title Page,
Item [54], Title, the word "A" (as inserted by the Certificate of Correction issued April 17, 2012) should be deleted and the title is reinstated to read --METHOD OF MANUFACTURING A PIEZOELECTRIC VIBRATOR--.

Signed and Sealed this
Eighth Day of May, 2012

David J. Kappos
*Director of the United States Patent and Trademark Office*